(12) United States Patent
Loh et al.

(10) Patent No.: US 12,087,642 B2
(45) Date of Patent: *Sep. 10, 2024

(54) SELECTIVE DUAL SILICIDE FORMATION

(71) Applicant: Taiwan Semiconductor Manufacturing Company, Ltd., Hsinchu (TW)

(72) Inventors: Wei-Yip Loh, Hsinchu (TW); Yan-Ming Tsai, Toufen Township (TW); Yi-Ning Tai, Hsinchu (TW); Raghunath Putikam, Hsinchu (TW); Hung-Yi Huang, Hsin-chu (TW); Hung-Hsu Chen, Tainan (TW); Chih-Wei Chang, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/308,952

(22) Filed: Apr. 28, 2023

(65) Prior Publication Data

US 2023/0260847 A1    Aug. 17, 2023

Related U.S. Application Data

(63) Continuation of application No. 17/445,431, filed on Aug. 19, 2021, now Pat. No. 11,676,868.

(51) Int. Cl.
*H01L 21/8238* (2006.01)
*H01L 29/40* (2006.01)
(Continued)

(52) U.S. Cl.
CPC ........... *H01L 21/823814* (2013.01); *H01L 21/823821* (2013.01); *H01L 21/823871* (2013.01);
(Continued)

(58) Field of Classification Search
CPC ..... H01L 21/823814; H01L 21/823821; H01L 21/823871; H01L 29/401; H01L 29/0847;
(Continued)

(56) References Cited

U.S. PATENT DOCUMENTS

2006/0128150 A1\* 6/2006 Gandikota ........ C23C 16/45525
257/E21.585
2017/0084449 A1\* 3/2017 Dube ................ H01L 21/02172
(Continued)

*Primary Examiner* — Karen Kusumakar
*Assistant Examiner* — Adam S Bowen
(74) *Attorney, Agent, or Firm* — Harrity & Harrity, LLP

(57) ABSTRACT

Techniques described herein enable respective (different) types of metal silicide layers to be formed for p-type source/drain regions and n-type source/drain regions in a selective manner. For example, a p-type metal silicide layer may be selectively formed over a p-type source/drain region (e.g., such that the p-type metal silicide layer is not formed over the n-type source/drain region) and an n-type metal silicide layer may be formed over the n-type source/drain region (which may be selective or non-selective). This provides a low Schottky barrier height between the p-type metal silicide layer and the p-type source/drain region, as well as a low Schottky barrier height between the n-type metal silicide layer and the n-type source/drain region. This reduces the contact resistance for both p-type source/drain regions and n-type source/drain regions.

20 Claims, 31 Drawing Sheets

(51) Int. Cl.
  *H01L 29/08* (2006.01)
  *H01L 29/417* (2006.01)
  *H01L 29/47* (2006.01)

(52) U.S. Cl.
  CPC ........ *H01L 29/401* (2013.01); *H01L 29/0847* (2013.01); *H01L 29/41791* (2013.01); *H01L 29/47* (2013.01)

(58) Field of Classification Search
  CPC .................... H01L 29/41791; H01L 29/47; H01L 27/0924
  See application file for complete search history.

(56) References Cited

U.S. PATENT DOCUMENTS

2020/0091011 A1* 3/2020 Khaderbad ..... H01L 21/823871
2023/0054633 A1 2/2023 Loh et al.

* cited by examiner

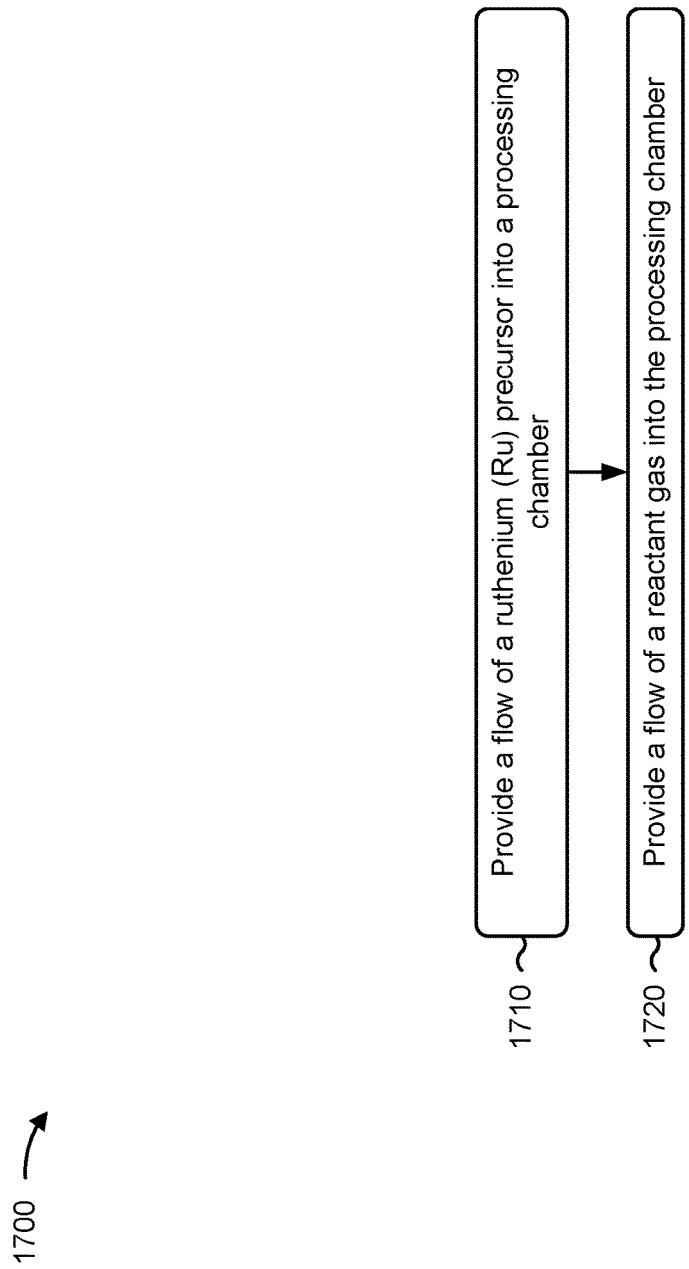

SELECTIVE DUAL SILICIDE FORMATION

RELATED APPLICATION

This application is a continuation of U.S. patent application Ser. No. 17/445,431, filed Aug. 19, 2021, which is incorporated herein by reference in its entirety.

BACKGROUND

Fin-based transistors, such as fin field effect transistors (finFETs) and nanostructure transistors (e.g., nanowire transistors, nanosheet transistors, gate-all-around (GAA) transistors, multi-bridge channel transistors, nanoribbon transistors), are three-dimensional structures that include a channel region in a fin (or a portion thereof) that extends above a semiconductor substrate as a three-dimensional structure. A gate structure, configured to control a flow of charge carriers within the channel region, wraps around the fin of semiconductor material. As an example, in a finFET, the gate structure wraps around three sides of the fin (and thus the channel region), thereby enabling increased control over the channel region (and therefore switching of the finFET). As another example, in a nanostructure transistor, the gate structure wraps around a plurality of channel regions in a fin structure such that the gate structure surrounds each of the plurality of channel regions. Source/drain regions (e.g., epitaxial regions) are located on opposing sides of the gate structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 15-17 are flowcharts of example processes relating to selective dual silicide formation described herein.

DETAILED DESCRIPTION

Figure 1:
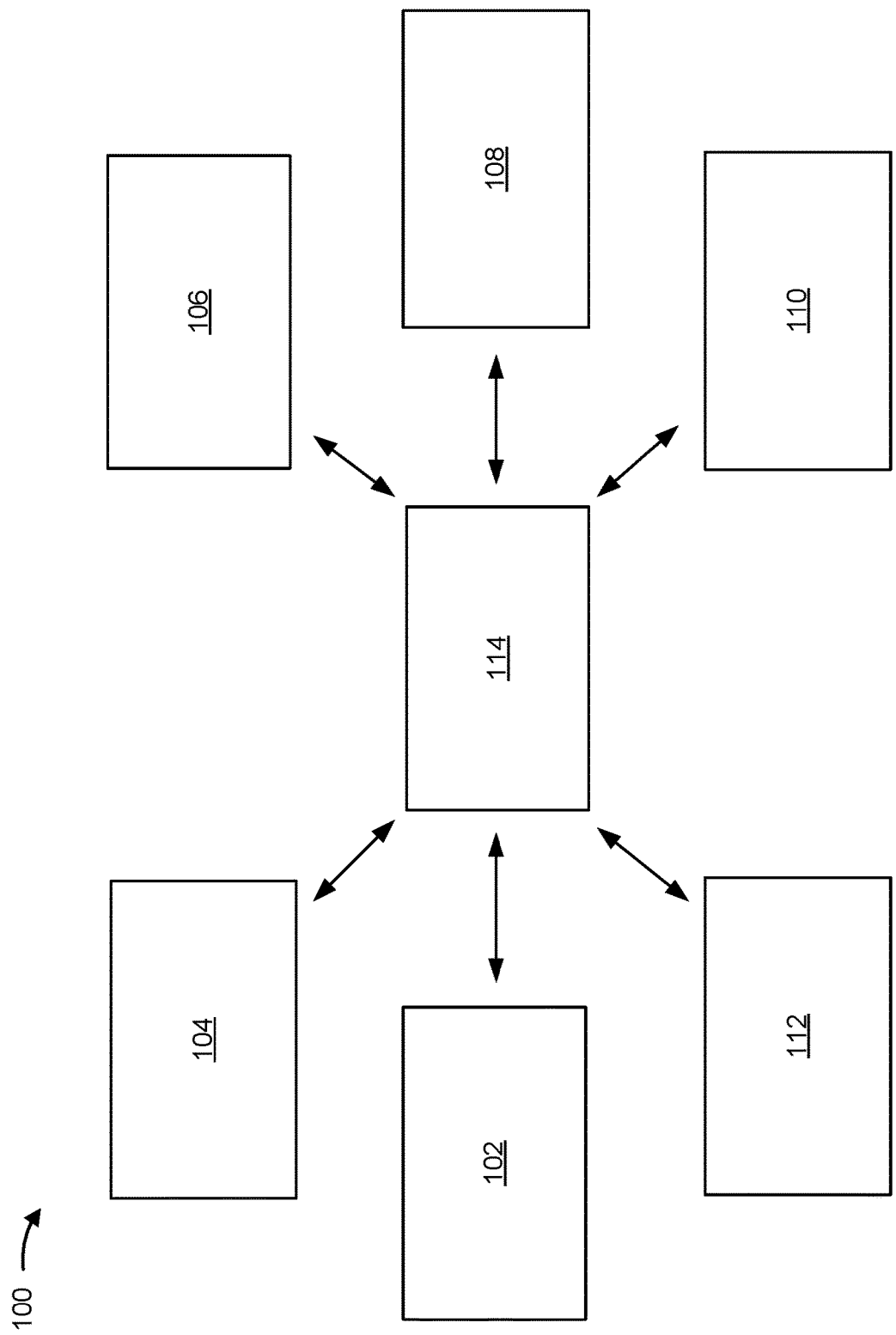
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A metal silicide layer may be formed on a top surface of a source/drain region (e.g., an epitaxial region) prior to formation of a source/drain contact (e.g., a metal source/drain contact (MD)) over the source/drain region to decrease contact resistance between a source/drain region and the source/drain contact. The top surface of the source/drain region may be prepared for the metal silicide using a pre-clean process (e.g., an epitaxial pre-clean process, a silicide pre-clean process) to remove residual oxides and other contaminates. After the pre-clean process, a metal layer is formed over the source/drain region, and the wafer is subjected to a high-temperature anneal which causes the metal to react with silicon to form the metal silicide layer.

The source/drain regions of a semiconductor device may be doped with different types of dopants. For example, a subset of source/drain regions may be doped with a p-type material and another subset of source/drain regions may be doped with an n-type material. As a result, if the same type of metal silicide layer is used for both types of source/drain regions (e.g., p-type source/drain regions and n-type source/drain regions), the intrinsic thermionic barrier of the metal silicide layer used for the source/drain regions will be preferential to either n-type source/drain regions or p-type source/drain regions but not both. This can lead to different thermionic barrier properties for the n-type source/drain regions and the p-type source/drain regions, which can result in increased contact resistance for a particular type of source/drain region.

As an example, an n-type metal silicide layer formed over an n-type source/drain region may provide a low n-type Schottky barrier height ($\Phi_{Bn}$—the distance between the conduction band edge ($E_C$) and the Fermi energy level ($E_F$)) at the junction between the n-type metal silicide layer and the n-type source/drain region, and therefore a low contact resistance (e.g., because the junction functions as an ohmic junction). However, the same n-type metal silicide layer over a p-type source/drain region may provide a p-type high Schottky barrier height ($\Phi_{Bp}$—the distance between the valance band edge ($E_V$) and the Fermi energy level ($E_F$)) at the junction between the n-type metal silicide layer and the p-type source/drain region, and therefore a high contact resistance because the junction functions as a rectifier junction (e.g., a p-n junction or diode).

Some implementations described herein provide techniques and apparatuses for selective dual silicide formation in a semiconductor device. The techniques described herein enable respective (different) types of metal silicide layers to be formed for p-type source/drain regions and n-type source/drain regions in a selective manner that reduces process complexity. For example, a p-type metal silicide layer may be selectively formed over a p-type source/drain region (e.g., such that the p-type metal silicide layer is not formed over the n-type source/drain region) and an n-type metal silicide layer may be formed over the n-type source/drain region (which may be selective or non-selective). This provides a low Schottky barrier height between the p-type metal silicide layer and the p-type source/drain region, as well as a low Schottky barrier height between the n-type metal silicide layer and the n-type source/drain region. This reduces the contact resistance for both p-type source/drain regions and n-type source/drain regions.

The selective dual silicide formation techniques described herein enable a p-type metal silicide layer and an n-type metal silicide layer to be formed in-situ, in that the operations for forming the p-type metal silicide layer and the n-type metal silicide layer are performed under the same vacuum (e.g., without breaking the vacuum between the p-type metal silicide layer formation operation and the n-type metal silicide layer formation operation). This enables the dual silicide formation operations to be performed with only a single pre-clean operation prior to the p-type metal silicide layer formation operation (e.g., as opposed to performing a second pre-clean operation between the p-type metal silicide layer formation operation and the n-type metal silicide layer formation operation, which would be performed to clean the n-type source/drain regions due to breaking the vacuum between operations), but is not limited thereto. For example, more than one pre-clean processes may be applied to the wafer in some embodiments. This reduces process complexity and reduces the likelihood of dielectric damage and critical dimension enlargement (e.g., critical dimension enlargement of approximately 4 nanometers to approximately 10 nanometers, among other example ranges, can be avoided) from additional plasma or chemical surface cleaning. Moreover, this enables the vacuum to be maintained such that a metal barrier layer for the p-type metal silicide layer and the n-type metal silicide layer may be formed in the same operation, which further reduces process complexity.

In addition, the selective dual silicide formation techniques described herein enable precise and independent thickness control to form the p-type metal silicide layer and the n-type metal silicide layer to optimal thicknesses. In some implementations, the n-type metal silicide layer may be formed over the p-type metal silicide layer such that the p-type metal silicide layer may be formed relatively thin (e.g., approximately 5 angstroms to approximately 50 angstroms, or another thickness value) to control the silicon (Si) consumption of the p-type metal silicide layer.

FIG. 1 is a diagram of an example environment 100 in which systems and/or methods described herein may be implemented. As shown in FIG. 1, environment 100 may include a plurality of semiconductor processing tools 102-112 and a wafer/die transport tool 114. The plurality of semiconductor processing tools 102-112 may include a deposition tool 102, an exposure tool 104, a developer tool 106, an etch tool 108, a planarization tool 110, a plating tool 112, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the deposition tool 102 includes an epitaxial tool that is configured to form layers and/or regions of a device by epitaxial growth. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

Wafer/die transport tool 114 includes a mobile robot, a robot arm, a tram or rail car, an overhead hoist transport (OHT) system, an automated materially handling system (AMHS), and/or another type of device that is configured to transport substrates and/or semiconductor devices between semiconductor processing tools 102-112, that is configured to transport substrates and/or semiconductor devices between processing chambers of the same semiconductor processing tool, and/or that is configured to transport substrates and/or semiconductor devices to and from other locations such as a wafer rack, a storage room, and/or the like. In some implementations, wafer/die transport tool 114 may be a programmed device that is configured to travel a particular path and/or may operate semi-autonomously or autonomously. In some implementations, the semiconductor processing environment 100 includes a plurality of wafer/die transport tools 114.

For example, the wafer/die transport tool 114 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 114 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations). In these implementations, the wafer/die transport tool 114 is configured to transport substrates and/or semiconductor devices between the processing chambers of the deposition tool 102 without breaking or removing a vacuum (or an at least partial vacuum) between the processing chambers and/or between processing operations in the deposition tool 102, as described herein.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2:
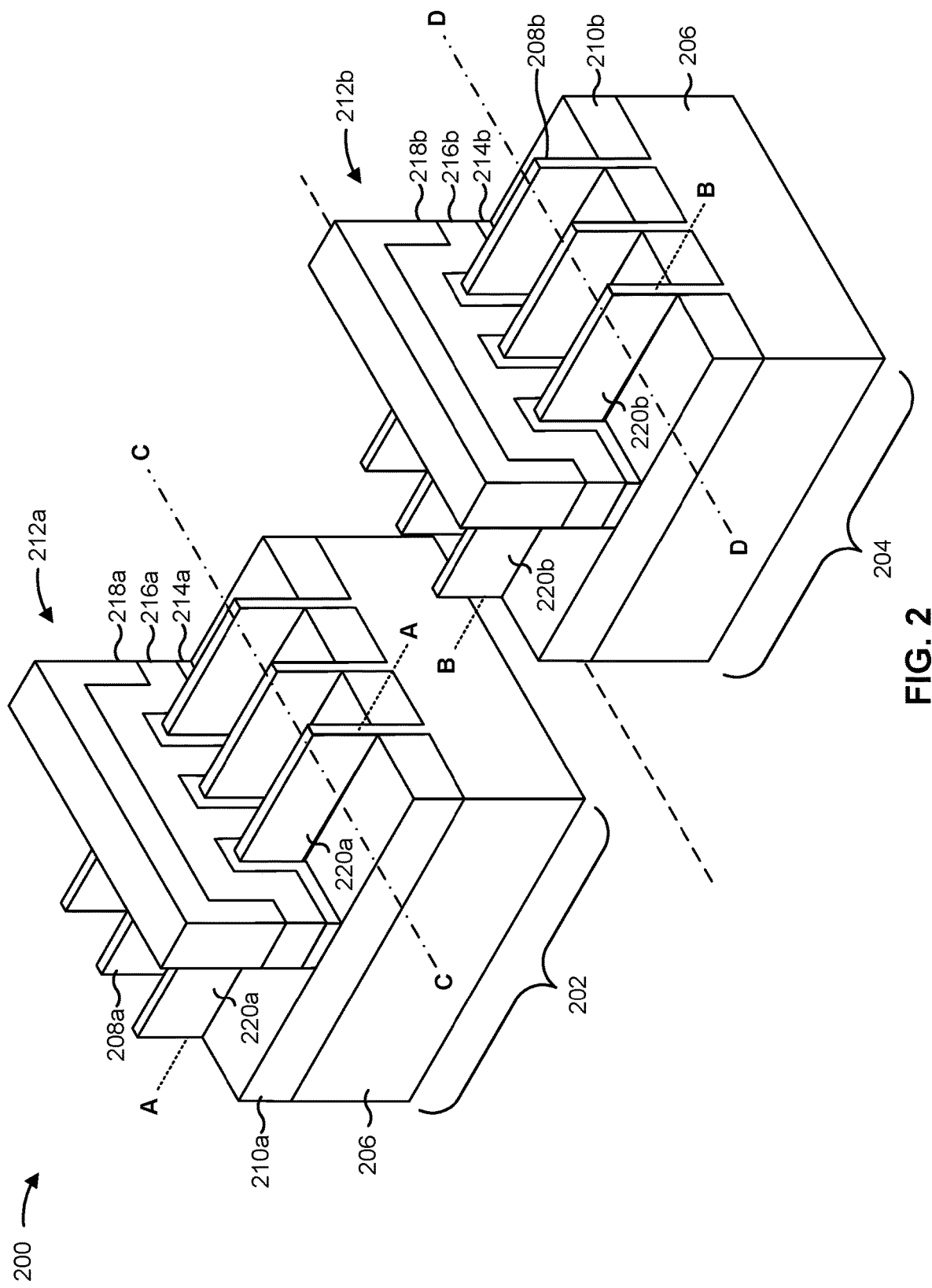
FIG. 2 is a diagram of regions of an example semiconductor device described herein.

FIG. 2 is a diagram of example regions of a semiconductor device 200 described herein. In particular, FIG. 2 illustrates an example p-type metal oxide semiconductor (PMOS) region 202 of the semiconductor device 200 and an example n-type metal oxide semiconductor (NMOS) region 204 of the semiconductor device 200, which are formed in different regions on the same substrate 206. FIGS. 3A-7 are schematic cross-sectional views of various portions of the PMOS region 202 and the NMOS region 204 illustrated in FIG. 2, and correspond to various processing stages of forming fin-based transistors in the PMOS region 202 and in the NMOS region 204.

The substrate 206 includes a silicon (Si) substrate, a substrate formed of a material including silicon, a III-V compound semiconductor material substrate such as gallium arsenide (GaAs), a silicon on insulator (SOI) substrate, a germanium substrate (Ge), a silicon germanium (SiGe) substrate, or another type of semiconductor substrate. The substrate 206 may include a round/circular substrate having an approximately 200 mm diameter, an approximately 300 mm diameter, or another diameter, such as 450 mm, among other examples. The substrate 206 may alternatively be any polygonal, square, rectangular, curved, or otherwise non-circular workpiece, such as a polygonal substrate.

Fin structures are included above the substrate 206 for the PMOS region 202 and the NMOS region 204. In particular, fin structures 208a are included above substrate 206 in the PMOS region 202, and fin structures 208b are formed in the substrate 206 in the NMOS region 204. Each fin structure 208a and 208b provides an active region where one or more devices (e.g., fin-based transistors) are formed. In some implementations, the fin structures 208a and 208b include silicon materials or another elementary semiconductor material, such as germanium, or a compound semiconductor material such as silicon carbide, gallium arsenic, gallium phosphide, indium phosphide, indium arsenide, and/or indium antimonide. In some implementations, the fin structures 208a and 208b may include an alloy semiconductor material such as silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), or a combination thereof. In some implementations, the fin structures 208a and 208b may be doped using n-type and/or p-type dopants.

The fin structures 208a and 208b are fabricated by suitable semiconductor process techniques, such as masking, photolithography, and/or etch processes, among other examples. As an example, the fin structures 208a and 208b may be formed by etching a portion of the substrate 206 away to form recesses in the substrate 206. The recesses may then be filled with isolating material that is recessed or etched back to form shallow trench isolation (STI) regions 210a above the substrate 206 and between the fin structures 208a, and STI regions 210b above the substrate 206 and between the fin structures 208b. Other fabrication techniques for the STI regions 210a and 210b and/or the fin structures 208a and 208b may be used. The STI regions 210a and 210b may electrically isolate adjacent active areas in the fin structures 208a and 208b. The STI regions 210a and 210b may include a dielectric material such as a silicon oxide ($SiO_x$), a silicon nitride ($Si_xN_y$), a silicon oxynitride (SiON), fluoride-doped silicate glass (FSG), a low-k dielectric material, and/or other suitable insulating material. The STI regions 210a and 210b may include a multi-layer structure, for example, having one or more liner layers.

A dummy gate structure 212a is included in the PMOS region 202 over the fin structures 208a (e.g., approximately perpendicular to the fin structures 208a), and a dummy gate structure 212b is included in the NMOS region 204 over the fin structures 208b (e.g., approximately perpendicular to the fin structures 208b). In the example depicted in FIG. 2, the dummy gate structure 212a includes a gate dielectric layer 214a, a gate electrode layer 216a, and a hard mask layer 218a. Similarly, the dummy gate structure 212b includes a gate dielectric layer 214b, a gate electrode layer 216b, and a hard mask layer 218b. In some implementations, the dummy gate structures 212a and 212b further include a capping layer and/or another suitable layer. The various layers in the dummy gate structures 212a and 212b may be formed by suitable deposition techniques and patterned by suitable photolithography and etching techniques. The dummy gate structure 212a engages the fin structures 208a on two or three sides of the fin structure 208a, and the dummy gate structure 212b engages the fin structures 208b on two or three sides of the fin structure 208b.

The term, "dummy", as described here, refers to a sacrificial structure which will be removed in a later stage and will be replaced with another structure, such as a high dielectric constant (high-k) dielectric and metal gate structure in a replacement gate process. The replacement gate process refers to manufacturing a gate structure at a later stage of the overall gate manufacturing process. The gate dielectric layers 214a and 214b may include a dielectric oxide layer. For example, the dielectric oxide layer may be formed by chemical oxidation, thermal oxidation, ALD, CVD, and/or other suitable methods. The gate electrode layers 216a and 216b may include a poly-silicon layer or another suitable layer. For example, the gate electrode layers 216a and 216b may be formed by suitable deposition processes such as low-pressure chemical vapor deposition (LPCVD) or plasma-enhanced CVD (PECVD), among other examples. The hard mask layers 218a and 218b may include any material suitable to pattern the gate electrode layer 216a and 216b, respectively, with particular features/dimensions on the substrate 206.

In some implementations, the various layers of the dummy gate structures 212a and 212b are first deposited as blanket layers. Then, the blanket layers are patterned through a process including photolithography and etching processes, removing portions of the blanket layers and keeping the remaining portions over the STI regions 210a and 210b and the fin structures 208a and 208b to form the dummy gate structures 212a and 212b.

Source/drain areas 220a are disposed in opposing regions of the fin structures 208a with respect to the dummy gate structure 212a. Similarly, source/drain areas 220b are disposed in opposing regions of the fin structures 208b with respect to the dummy gate structure 212b. The source/drain areas 220a include areas in the PMOS region 202 in which source/drain regions are formed. The source/drain regions in the PMOS region 202 include silicon (Si) with a p-type material such as boron (B) or germanium (Ge), among other examples. Accordingly, the PMOS region 202 includes PMOS transistors that include p-type source/drain regions. The source/drain areas 220b include areas in the NMOS region 204 in which source/drain regions are formed. The source/drain regions in the NMOS region 204 include silicon (Si) with an n-type material such as phosphorous (P) or arsenic (As), among other examples. Accordingly, the NMOS region 204 includes NMOS transistors that include n-type source/drain regions.

Some source/drain regions may be shared between various transistors in the PMOS region 202, and/or some source/drain regions may be shared between various transistors in the NMOS region 204. In some implementations, various ones of the source/drain regions may be connected or coupled together such that fin-based transistors in the PMOS region 202 and/or in the NMOS region 204 are implemented as two functional transistors. For example, if neighboring (e.g., as opposed to opposing) source/drain regions are electrically connected, such as through coalescing the regions by epitaxial growth (e.g., neighboring source/drain regions, as opposed to on opposing sides of a dummy gate structure 212a or 212b, being coalesced), two functional transistors may be implemented. Other configurations in other examples may implement other numbers of functional transistors.

FIG. 2 further illustrates reference cross-sections that are used in later figures, including FIGS. 3A-7. Cross-section A-A is in a plane along a channel in a fin structure 208a between opposing source/drain areas 220a. Cross-section B-B is in a plane along a channel in a fin structure 208b between opposing source/drain areas 220b. Cross-section C-C is in a plane perpendicular to cross-section A-A, and is across a source/drain area 220a in fin structure 208a. Cross-section D-D is in a plane perpendicular to cross-section B-B and is across a source/drain area 220b in fin structure 208b. Subsequent figures refer to these reference cross-sections for clarity. In some figures, some reference numbers of components or features illustrated therein may be omitted to avoid obscuring other components or features for ease of depicting the figures.

As indicated above, FIG. 2 is provided as an example. Other examples may differ from what is described with regard to FIG. 2.

FIGS. 3A-3D are diagrams of an example implementation 300 described herein. The example implementation 300 includes an example of forming fin structures 208a and 208b for PMOS and NMOS transistors of the semiconductor device 200. FIGS. 3A-3D are illustrated from the perspective of the cross-sectional plane C-C in FIG. 2 for the PMOS region 202, and from the perspective of the cross-sectional plane D-D in FIG. 2 for the NMOS region 204.

Figure 3A:
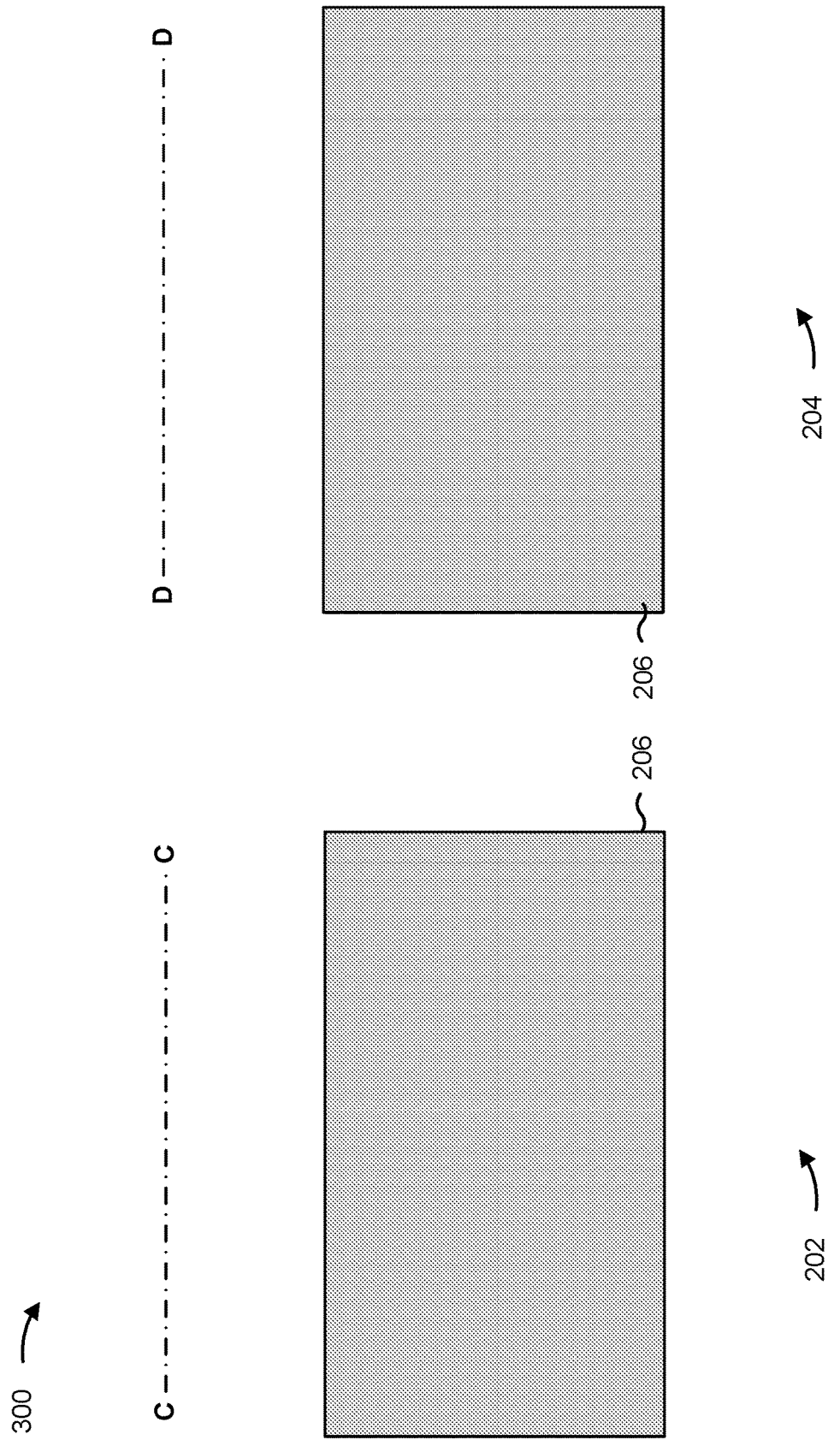
FIGS. 3A-3D, 4A-4E, 5A-5D, and 6A-6F are diagrams of one or more example implementations described herein.

Turning to FIG. 3A, the example implementation 300 includes semiconductor processing operations relating to the substrate 206 in and/or on which PMOS transistors are formed in the PMOS region 202, and in and/or on which NMOS transistors are formed in the NMOS region 204.

Figure 3B:
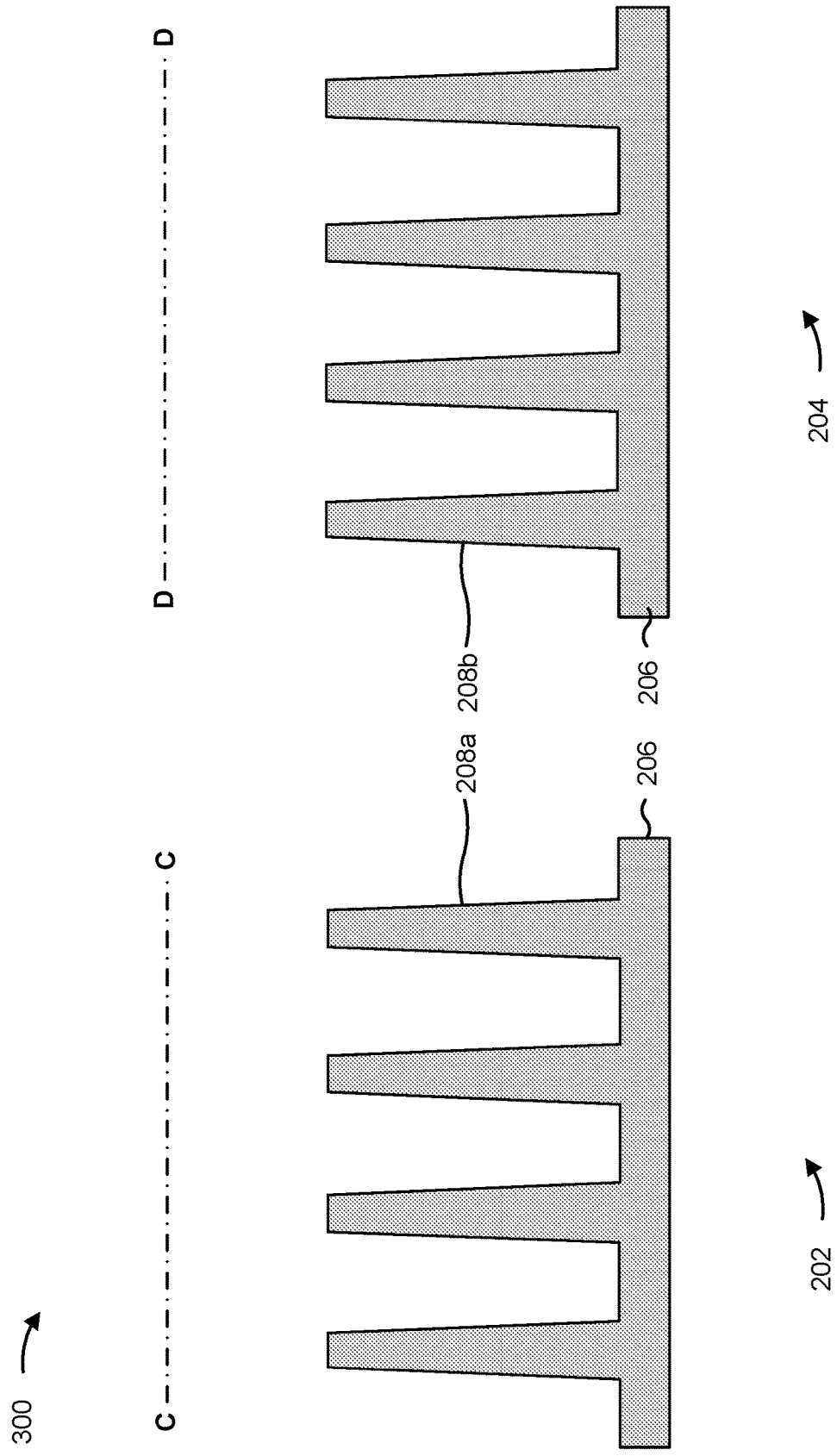

As shown in FIG. 3B, fin structures 208a and 208b are formed in PMOS region 202 and in the NMOS region 204, respectively, on the substrate 206. In particular, one or more fin structures 208a are formed in PMOS region 202 in the substrate 206, and one or more fin structures 208b are formed in the NMOS region 204 in the substrate 206.

In some implementations, a pattern in a photoresist layer is used to form the fin structures 208a and 208b. In these implementations, the deposition tool 102 forms the photoresist layer on the substrate 206. The exposure tool 104 exposes the photoresist layer to a radiation source to pattern the photoresist layer. The developer tool 106 develops and removes portions of the photoresist layer to expose the pattern. The etch tool 108 etches into the substrate 206 to form the fin structures 208a and 208b. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the fin structures 208a and 208b based on a pattern.

Figure 3C:
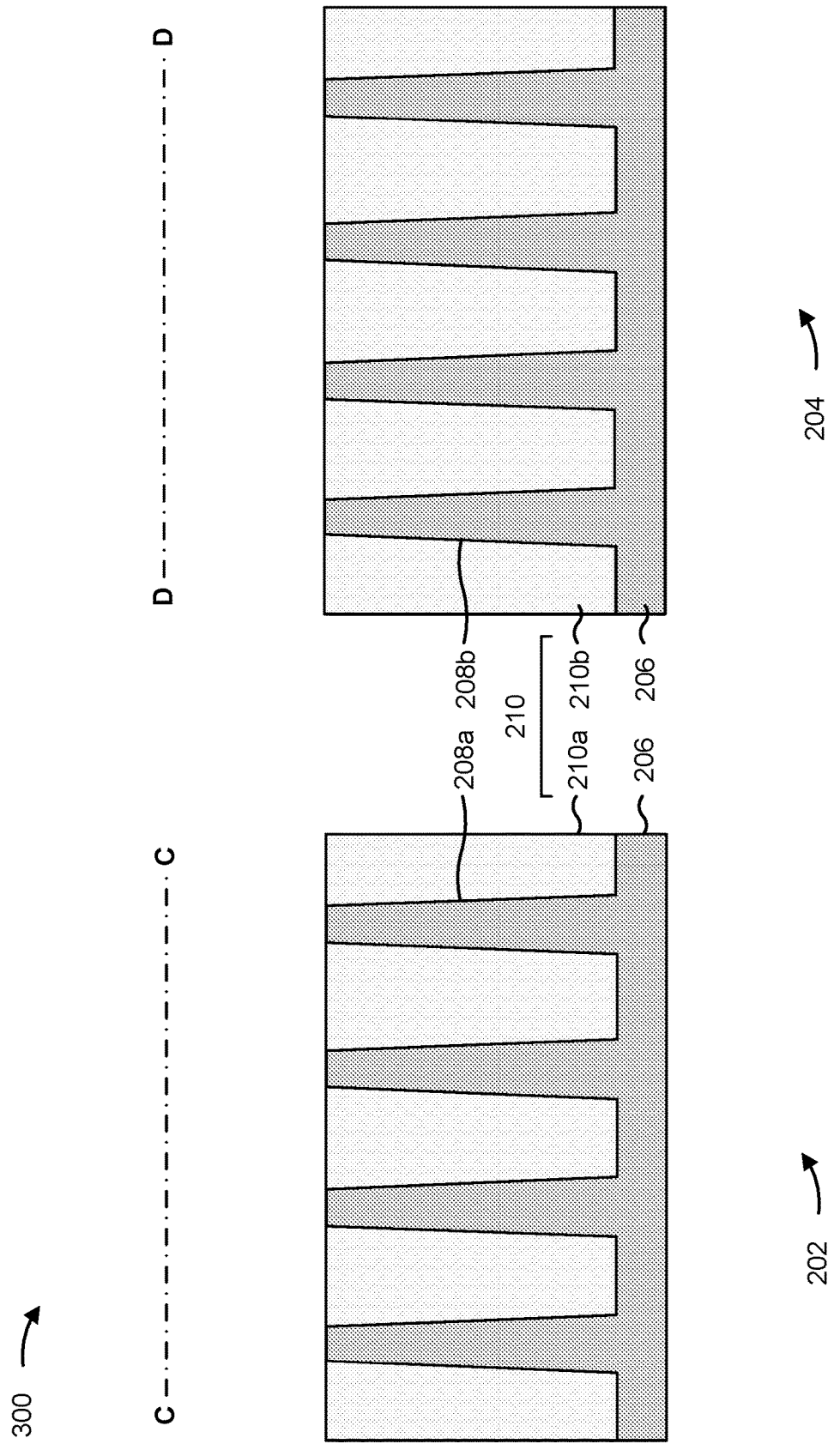

As shown in FIG. 3C, an STI layer 210 is formed in between the fin structures 208a and 208b. The deposition tool 102 deposits the STI layer 210 by a CVD technique, a PVD technique, an ALD technique, a deposition technique described above in connection with FIG. 1, and/or another deposition technique. In some implementations, the STI layer 210 is formed to a height that is greater than the height of the fin structures 208a and 208b. In these implementations, the planarization tool 110 performs a planarization (or polishing) operation to planarize the STI layer 210 such that the top surface of the STI layer 210 is substantially flat and smooth, and such that the top surface of the STI layer 210 and the top surface of the fin structures 208a and 208b are approximately the same height. The planarization operation may increase uniformity in the STI regions 210a and 210b that are formed in a subsequent etch-back operation.

Figure 3D:
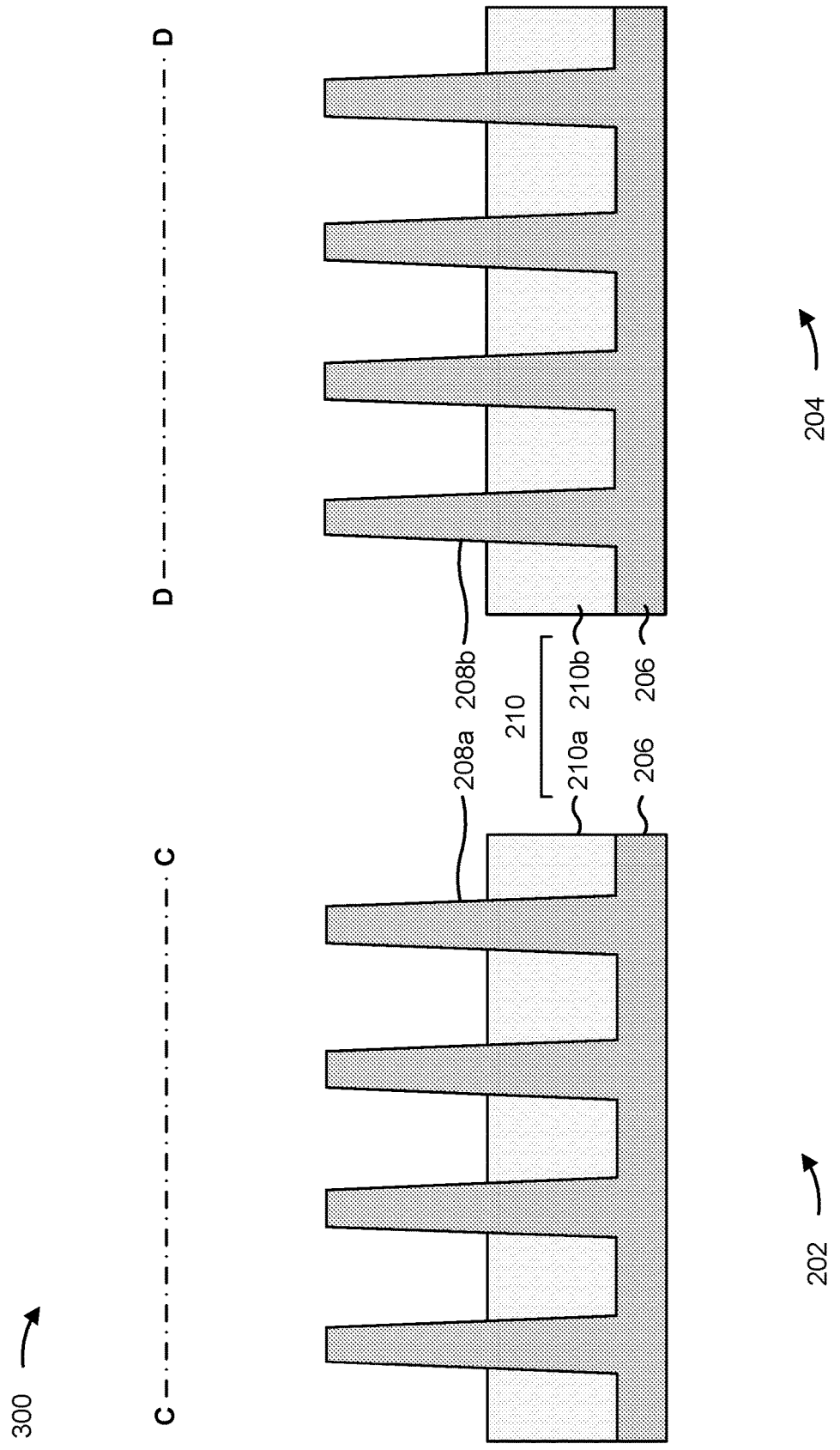

As shown in FIG. 3D, the STI layer 210 is etched in an etch back operation to expose portions of the fin structures 208a and 208b. The etch tool 108 etches a portion of the STI layer 210 by a plasma etch technique, a wet chemical etch technique, and/or another type of etch technique. The remaining portions of the STI layer 210 between the fin structures 208a include the STI regions 210a, and the remaining portions of the STI layer 210 between the fin structures 208b include the STI regions 210b. In some implementations, the STI layer 210 is etched such that the height of the exposed portions of the fin structures 208a (e.g., the portions of the fin structures 208a that are above the top surface of the STI regions 210a) and the height of the exposed portions of the fin structures 208b (e.g., the portions of the fin structures 208b that are above the top surface of the STI regions 210b) are the same height. In some implementations, the STI layer 210 is etched such that the height of the exposed portions of the fin structures 208a and the height of the exposed portions of the fin structures 208b are different, which enables the fin heights to be tuned to achieve particular performance characteristics for the PMOS region 202 and for the NMOS region 204.

As indicated above, FIGS. 3A-3D are provided as an example. Other examples may differ from what is described with regard to FIGS. 3A-3D.

FIGS. 4A-4E are diagrams of an example implementation 400 described herein. The example implementation 400 includes an example of forming source/drain regions in the source/drain areas 220a and 220b of the PMOS region 202 and the NMOS region 204, respectively, of the semiconductor device 200. FIGS. 4A-4E are illustrated from the perspective of the cross-sectional plane A-A in FIG. 2 for the PMOS region 202, and from the perspective of the cross-sectional plane B-B in FIG. 2 for the NMOS region 204. In some implementations, the operations described in connection with the example implementation 400 are performed after the fin formation process described in connection with FIGS. 3A-3D.

Figure 4A:
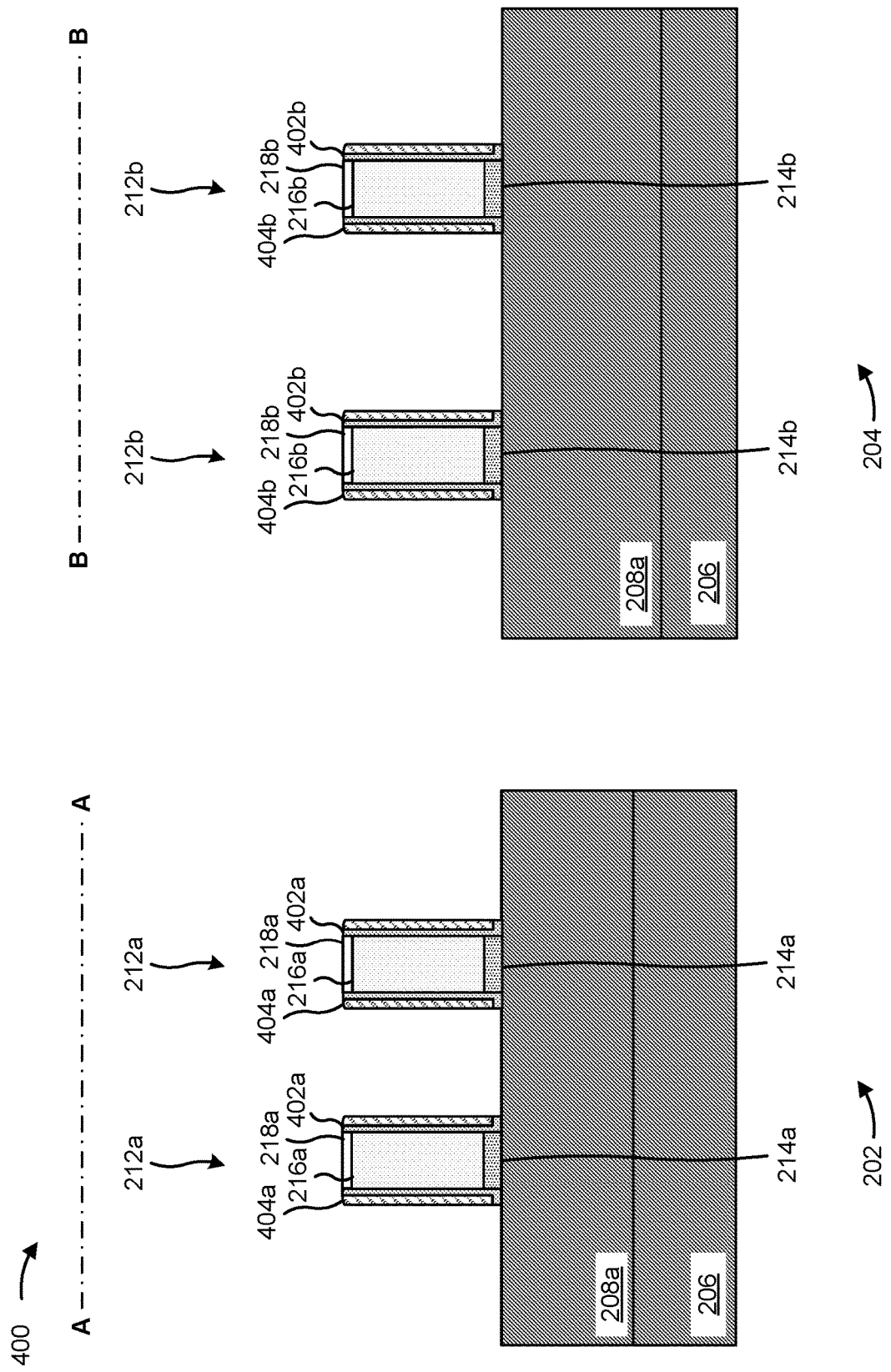

As shown in FIG. 4A, dummy gate structures 212a are formed in the PMOS region 202 and dummy gate structures 212b are formed in the NMOS region 204. The dummy gate structures 212a are formed and included over the fin structures 208a, and around the sides of the fin structures 208a such that the dummy gate structures 212a surround the fin structure 208a on at least three sides of the fin structure 208a. The dummy gate structures 212b are formed and included over the fin structure 208b, and around the sides of the fin structure 208b such that the dummy gate structures 212b surround the fin structure 208b on three sides of the fin structure 208b. The dummy gate structures 212a and 212b are formed as placeholders for the actual gate structures (e.g., replacement high-k gate or metal gate) that are to be formed for the transistors included in the PMOS region 202 and in the NMOS region 204, respectively. The dummy gate structures 212a and 212b may be formed as part of a replacement gate process, which enables other layers and/or structures to be formed prior to formation of the replacement gate structures.

The dummy gate structures 212a include the gate dielectric layer 214a, the gate electrode layer 216a, and the hard mask layer 218b. The dummy gate structures 212b include the gate dielectric layer 214b, the gate electrode layer 216b, and the hard mask layer 218b. The gate dielectric layers 214a and 214b may each include dielectric oxide layers. As an example, the gate dielectric layers 214a and 214b may each be formed (e.g., by the deposition tool 102) by chemical oxidation, thermal oxidation, ALD, CVD, and/or other suitable methods. The gate electrode layers 216a and 216b may each include a poly-silicon layer or other suitable layers. For example, the gate electrode layers 216a and 216b may be formed (e.g., by the deposition tool 102) by suitable deposition processes such as LPCVD or PECVD, among other examples. The hard mask layers 218a and 218b may each include any material suitable to pattern the gate electrode layers 216a and 216b, respectively, with particular dimensions and/or attributes. Examples include silicon nitride, silicon oxynitride, silicon carbon nitride, or a combination thereof, among other examples. The hard mask layers 218a and 218b may be deposited (e.g., by the deposition tool 102) by CVD, PVD, ALD, or another deposition technique.

As further shown in FIG. 4A, seal spacer layers 402a are included on the sidewalls of the dummy gate structures 212a. Similarly, seal spacer layers 402b are included on the sidewalls of the dummy gate structures 212b. The seal spacer layers 402a and 402b may be conformally deposited (e.g., by the deposition tool 102) and may include a silicon oxycarbide (SiOC), a nitrogen free SiOC, or another suitable material. The seal spacer layers 402a and 402b may be formed by an ALD operation in which various types of precursor gasses including silicon (Si) and carbon (C) are sequentially supplied in a plurality of alternating cycles to form the seal spacer layers 402a and 402b, among other example deposition techniques.

As further shown in FIG. 4A, bulk spacer layers 404a may be formed on the seal spacer layers 402a. Similarly, bulk spacer layers 404b may be formed on the seal spacer layers 402b. The bulk spacer layers 404a and 404b may be formed of similar materials as the seal spacer layers 402a and 402b. However, the bulk spacer layers 404a and 404b may formed without plasma surface treatment that is used for the seal spacer layers 402a and 402b. Moreover, the bulk spacer layers 404a and 404b may be formed to a greater thickness relative to the thickness of the seal spacer layers 402a and 402b.

In some implementations, the seal spacer layers 402a and 402b and the bulk spacer layers 404a and 404b are conformally deposited (e.g., by the deposition tool 102) on the dummy gate structures 212a and 212b respectively, and on the fin structures 208a and 208b respectively. The seal spacer layers 402a and 402b, and the bulk spacer layers 404a and 404b, are then patterned (e.g., by the deposition tool 102, the exposure tool 104, and the developer tool 106) and etched (e.g., by the etch tool 108) to remove the seal spacer layers 402a and 402b and the bulk spacer layers 404a and 404b from the tops of the dummy gate structures 212a and 212b respectively, and from the fin structures 208a and 208b respectively.

Figure 4B:
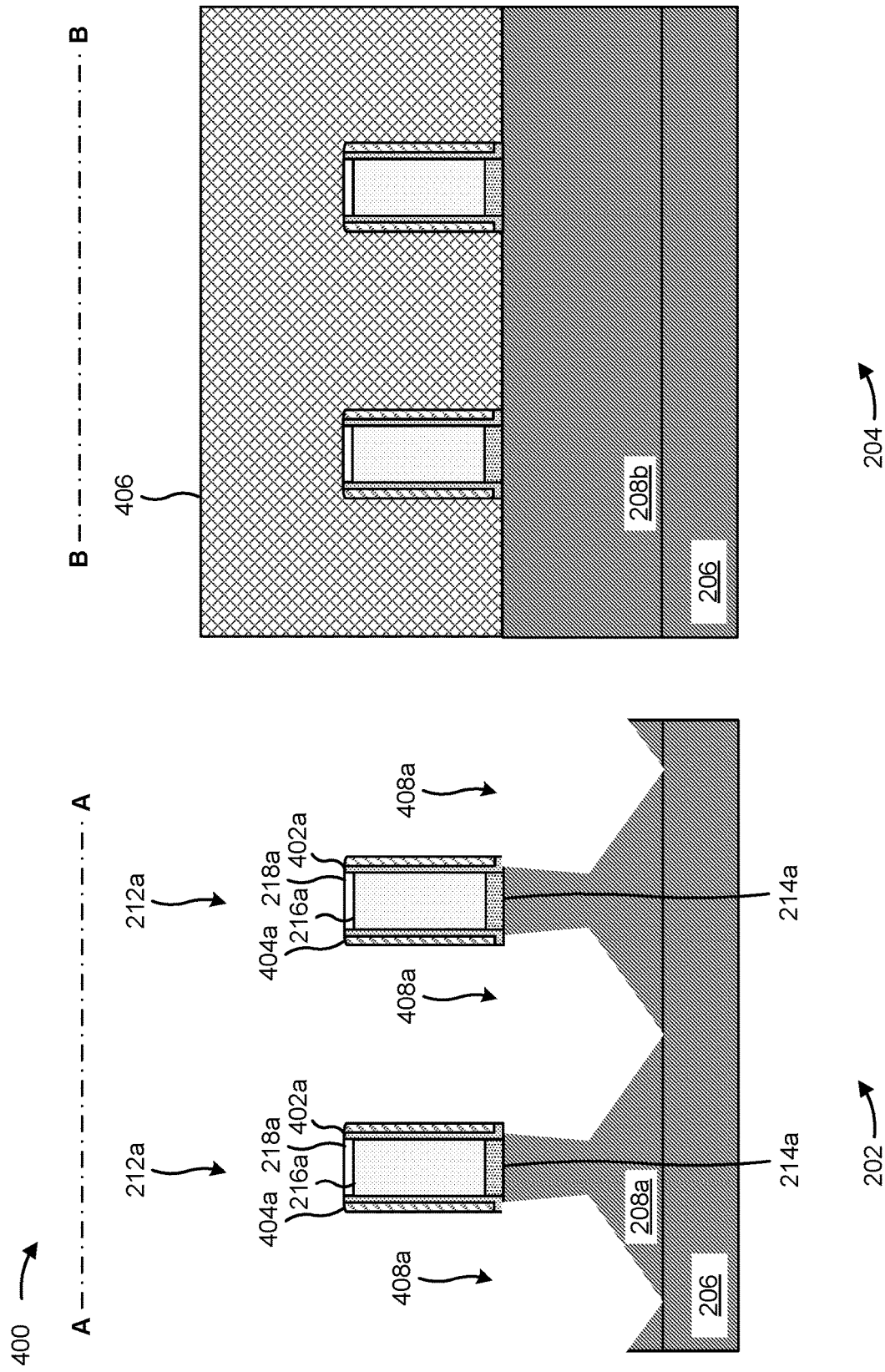

As shown in FIG. 4B, a photoresist layer 406 is formed over and/or on the fin structures 208b, and over and/or on the dummy gate structures 212b. The photoresist layer 406 may further be formed over the STI regions 210b (e.g., the exposed portions of the STI regions 210b). The deposition tool 102 forms the photoresist layer 406 by a spin-coating technique or another deposition technique. The photoresist layer 406 is formed to protect the fin structures 208b, the STI regions 210b, and the dummy gate structures 212b in a subsequent etch operation in which recesses for the source/drain regions of the PMOS region 202 are partially etched. Moreover, the photoresist layer 406 is formed to protect the fin structures 208b, the STI regions 210b, and the dummy gate structures 212b in a subsequent epitaxial growth operation in which the source/drain regions are formed in the recesses in the PMOS region 202.

As further shown in FIG. 4B, recesses 408a are formed in a fin structures 208a in the PMOS region 202 between the dummy gate structures 212a in a first etch operation. The first etch operation may be referred to a first strained source/drain (SSD) etch operation, and the recesses 408a may be referred to as first strained source/drain regions. The etch tool 108 forms the recesses 408a after the photoresist layer 406 is formed. In this way, the photoresist layer 406 protects the fin structure 208b and other structures in the NMOS region 204 from being etched in the first etch operation. In some implementations, the first etch operation includes a plasma etch technique, a wet chemical etch technique, and/or another type of etch technique.

Figure 4C:
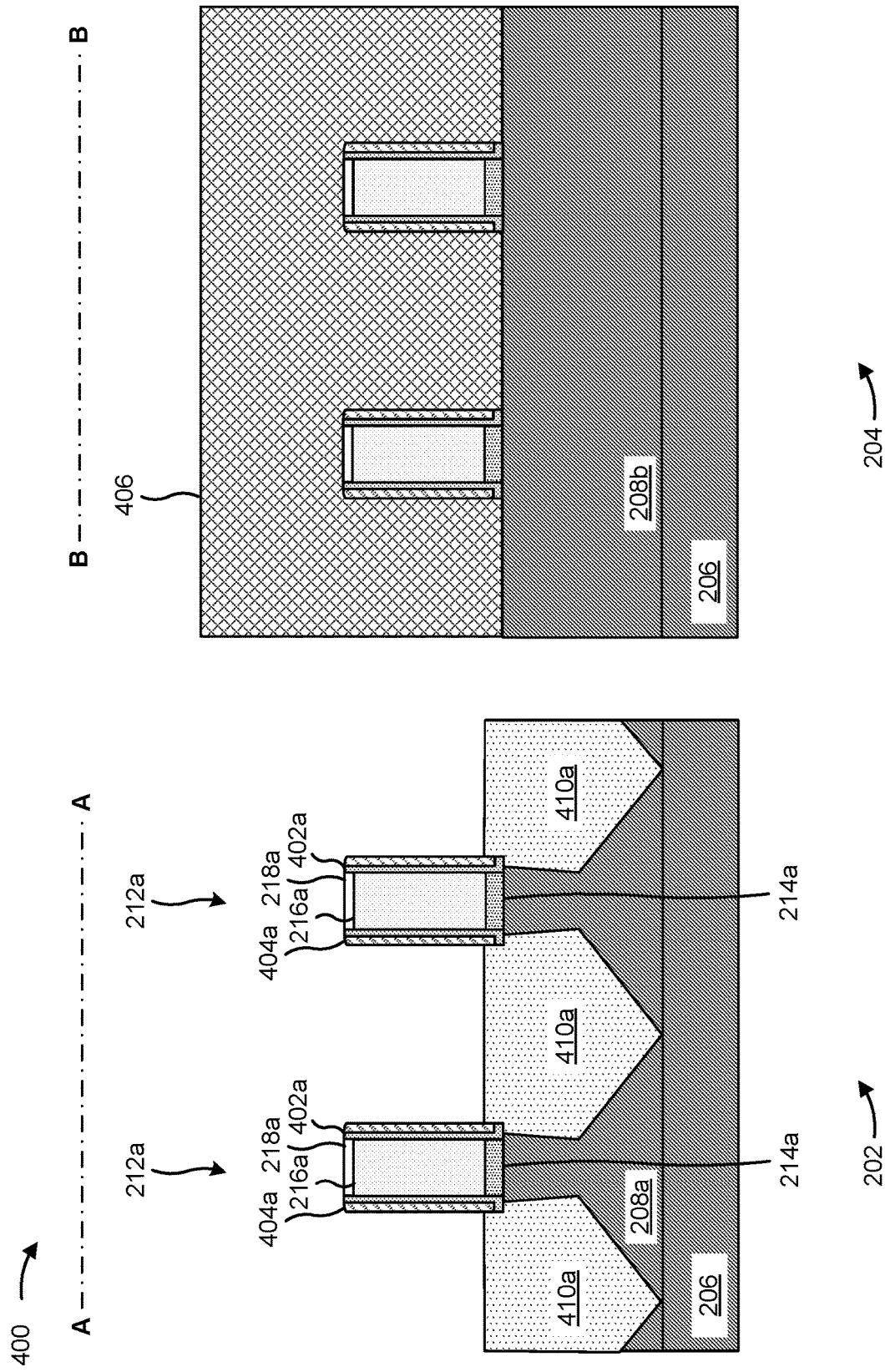

As shown in FIG. 4C, p-type source/drain regions 410a are formed in the recesses 408a in the PMOS region 202 of the semiconductor device 200 over the substrate 206. The deposition tool 102 forms the p-type source/drain regions 410a by an epitaxial operation, in which layers of the epitaxial material are deposited in the recesses 408a such that the layers of the p-type source/drain regions 410a are formed by epitaxial growth in a particular crystalline orientation. The p-type source/drain regions 410a are formed as the source/drain regions of PMOS transistors (e.g., PMOS finFETs, PMOS nanostructure transistors) included in the PMOS region 202. The p-type source/drain regions 410a are included between the dummy gate structures 212a and at least partially below and/or lower than the dummy gate structures 212a. The p-type source/drain regions 410a partially extend above the top surface of the fin structures 208a.

The material (e.g., silicon (Si), gallium (Ga), or another type of semiconductor material) that is used to form the p-type source/drain regions 410a is doped with a p-type dopant, which is a type of dopant that includes electron acceptor atoms that create holes in the material. The material may be doped by adding impurities (e.g., the p-type dopant) to a source gas that is used during the epitaxial operation. Examples of p-type dopants that may be used in the epitaxial operation include boron (B) or germanium (Ge), among other examples. The resulting material of the p-type source/drain regions 410a include silicon germanium ($Si_xGe_{1-x}$, where x can be in a range from approximately 0 to approximately 100) or another type of p-doped semiconductor material.

Figure 4D:
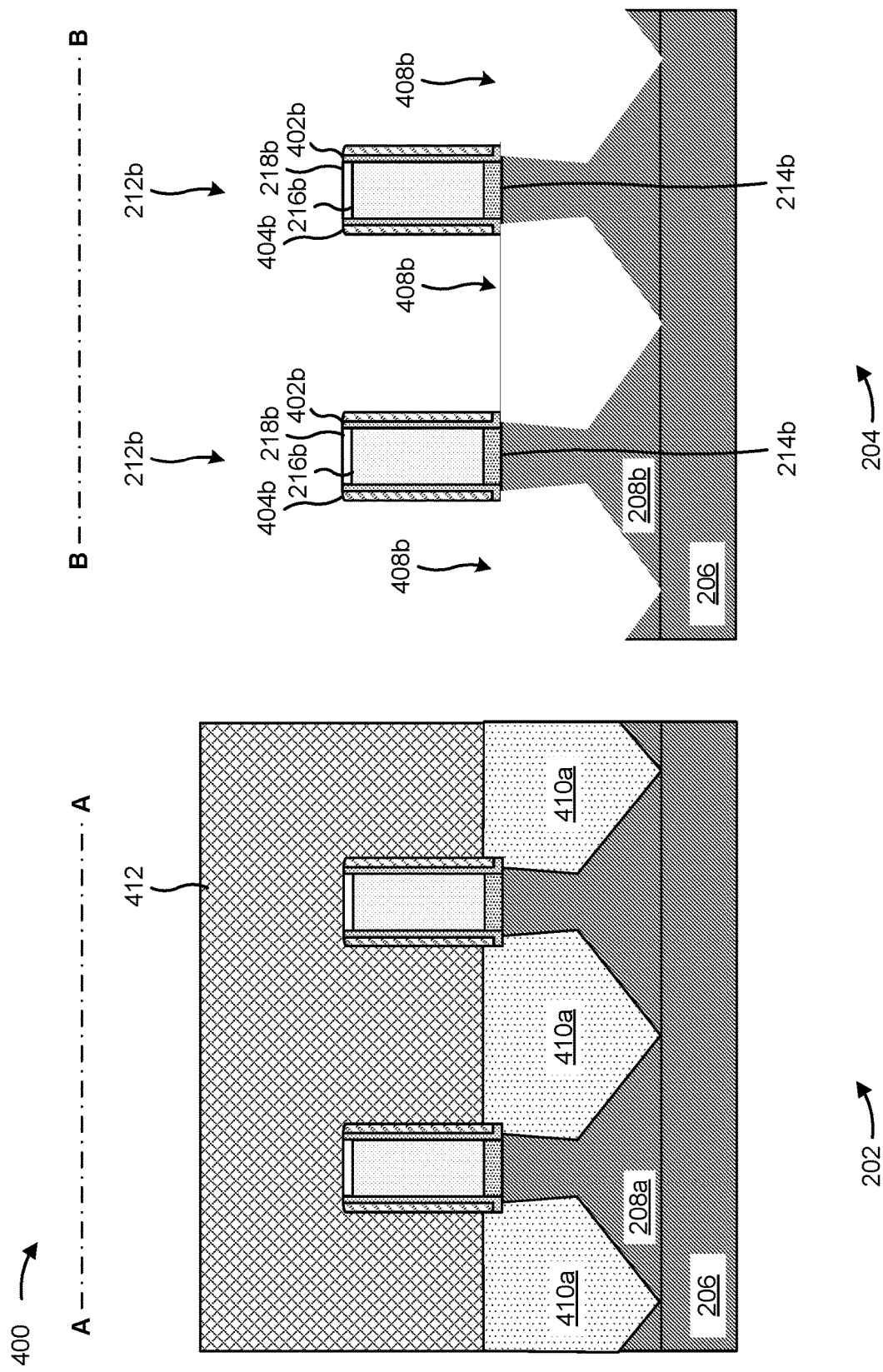

As shown in FIG. 4D, the photoresist layer 406 may be removed from the NMOS region 204 after the p-type source/drain regions 410a are formed. Subsequently, a photoresist layer 412 is formed over and/or on the fin structures 208a, over and/or on the dummy gate structures 212a, and over and/or on the p-type source/drain regions 410a. The photoresist layer 412 may further be formed over the STI regions 210a (e.g., the exposed portions of the STI regions 210a). The deposition tool 102 forms the photoresist layer 412 by a spin-coating technique or another deposition technique. The photoresist layer 412 is formed to protect the fin structures 208a, the STI regions 210a, the dummy gate structures 212a, and the p-type source/drain regions 410a in a subsequent etch operation in which recesses for the source/drain regions of the NMOS region 204 are partially etched. Moreover, the photoresist layer 412 is formed to protect the fin structures 208a, the STI regions 210a, the dummy gate structures 212a, and the p-type source/drain regions 410a in a subsequent epitaxial growth operation in which the source/drain regions are formed in the recesses in the NMOS region 204.

As further shown in FIG. 4D, recesses 408b are formed in a fin structures 208b in the NMOS region 204 between the dummy gate structures 212b in a second etch operation. The second etch operation may be referred to a second SSD etch operation, and the recesses 408b may be referred to as second strained source/drain regions. The etch tool 108 forms the recesses 408b after the photoresist layer 412 is formed. In this way, the photoresist layer 412 protects the fin structure 208b and other structures in the PMOS region 202 from being etched in the second etch operation. In some implementations, the second etch operation includes a plasma etch technique, a wet chemical etch technique, and/or another type of etch technique.

Figure 4E:
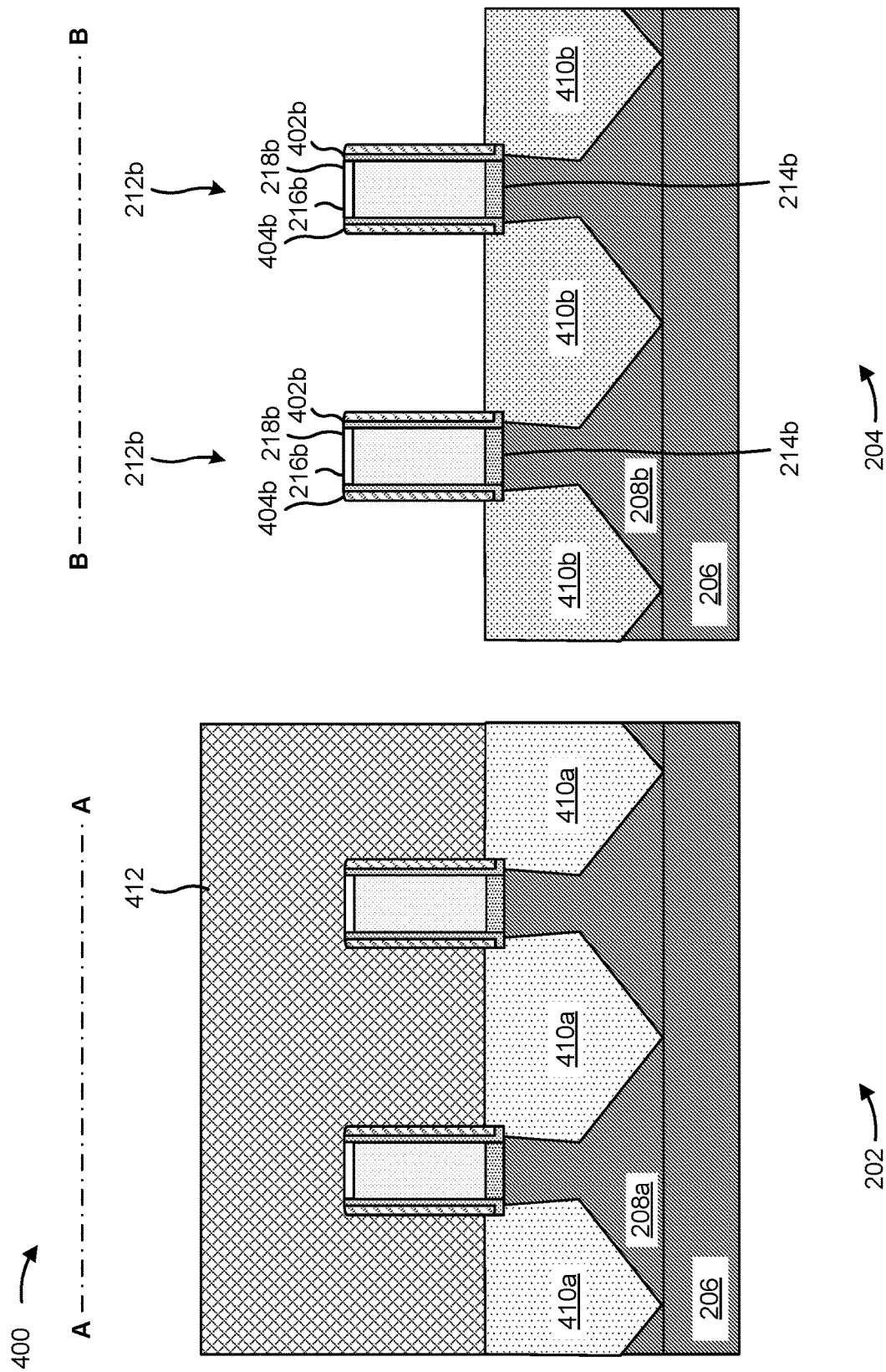

As shown in FIG. 4E, n-type source/drain regions 410b are formed in the recesses 408b in the NMOS region 204 of the semiconductor device 200 over the substrate 206. The deposition tool 102 forms the n-type source/drain regions 410b by an epitaxial operation, in which layers of the epitaxial material are deposited in the recesses 408b such that the layers of the n-type source/drain regions 410b are formed by epitaxial growth in a particular crystalline orientation. The n-type source/drain regions 410b are formed as the source/drain regions of NMOS transistors (e.g., NMOS finFETs, NMOS nanostructure transistors) included in the NMOS region 204. The n-type source/drain regions 410b are included between the dummy gate structures 212b and at least partially below and/or lower than the dummy gate structures 212b. The n-type source/drain regions 410b partially extend above the top surface of the fin structures 208b.

The material (e.g., silicon (Si), gallium (Ga), or another type of semiconductor material) that is used to form the n-type source/drain regions 410b is doped with an n-type dopant, which is a type of dopant that includes electron donor atoms that create mobile electrons in the material. The material may be doped by adding impurities (e.g., the n-type dopant) to a source gas that is used during the epitaxial operation. Examples of n-type dopants that may be used in the epitaxial operation include phosphorous (P) or arsenic (As), among other examples. The resulting material of the n-type source/drain regions 410b includes silicon phosphide (SixP_y) or another type of n-doped semiconductor material. The photoresist layer 406 may be removed from the PMOS region 202 after the n-type source/drain regions 410b are formed.

As indicated above, FIGS. 4A-4E are provided as an example. Other examples may differ from what is described with regard to FIGS. 4A-4E. For example, while the p-type source/drain regions 410a are formed prior to formation of the n-type source/drain regions 410b in the example implementation 400, the process may be reversed such that the n-type source/drain regions 410b are formed prior to formation of the p-type source/drain regions 410a.

FIGS. 5A-5D are diagrams of an example implementation 500 described herein. The example implementation 500 includes an example dummy gate replacement process, in which the dummy gate structures 212a and 212b are replaced with high-k gate structures and/or metal gate structures. FIGS. 5A-5D are illustrated from the perspective of the cross-sectional plane A-A in FIG. 2 for the PMOS region 202, and from the perspective of the cross-sectional plane B-B in FIG. 3 for the NMOS region 204.

Figure 5A:
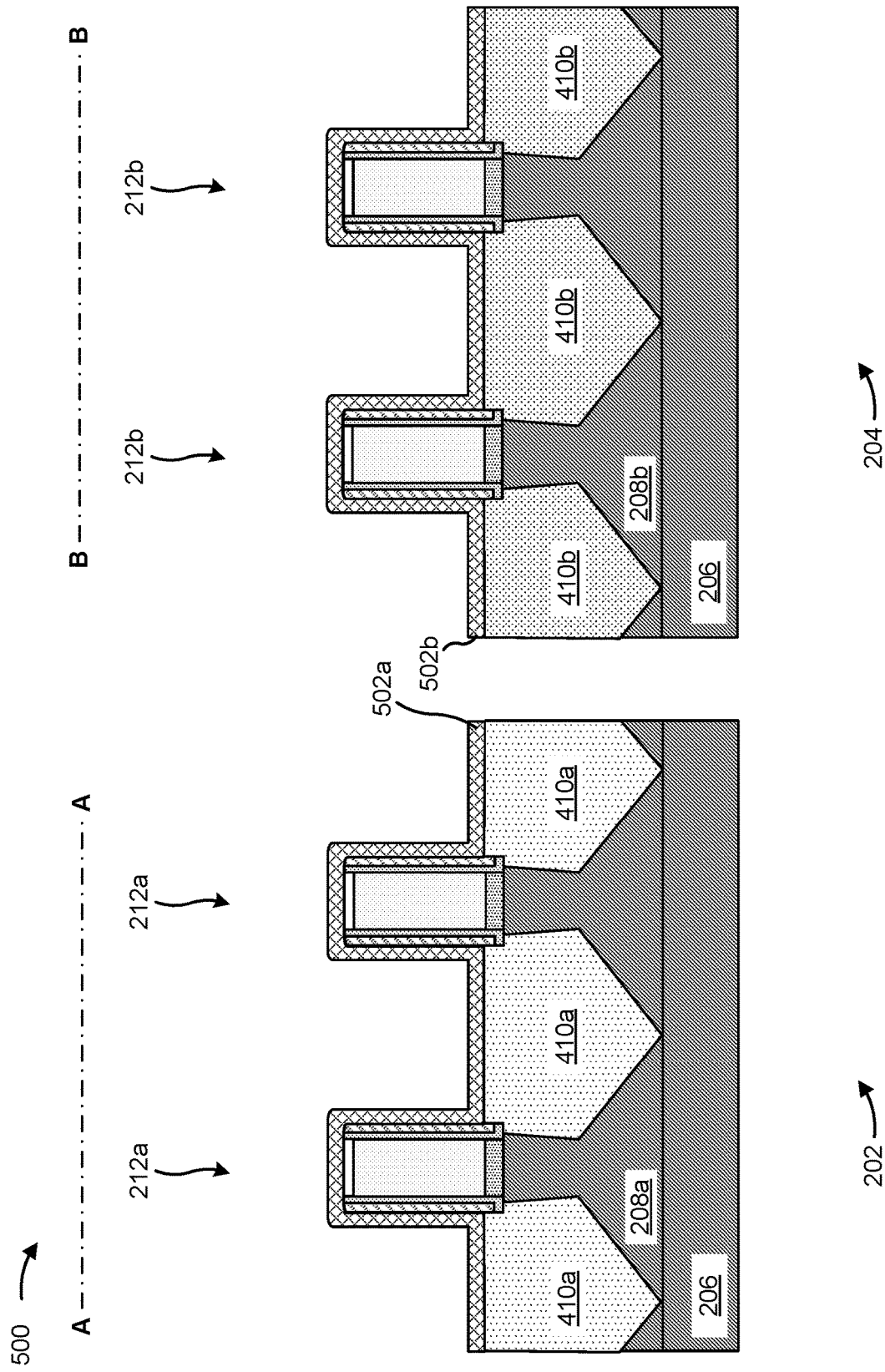

As shown in FIG. 5A, a contact etch stop layer (CESL) 502a is conformally deposited (e.g., by the deposition tool 102) over the p-type source/drain regions 410a, over the dummy gate structures 212a, and on the sidewalls of the bulk spacer layers 404a. Similarly, a CESL 502b is conformally deposited (e.g., by the deposition tool 102) over the n-type source/drain regions 410b, over the dummy gate structures 212b, and on the sidewalls of the bulk spacer layers 404b. The CESLs 502a and 502b may provide a mechanism to stop an etch process when forming contacts or vias for the PMOS region 202 and for the NMOS region 204, respectively. The CESLs 502a and 502b may be formed of a dielectric material having a different etch selectivity from adjacent layers or components. The CESLs 502a and 502b may include or may be a nitrogen containing material, a silicon containing material, and/or a carbon containing material. Furthermore the CESLs 502a and 502b may include or may be silicon nitride, silicon carbon nitride, carbon nitride, silicon oxynitride, silicon carbon oxide, or a combination thereof, among other examples. The CESLs 502a and 502b may be deposited by a deposition process, such as ALD, CVD, or another deposition technique.

Figure 5B:
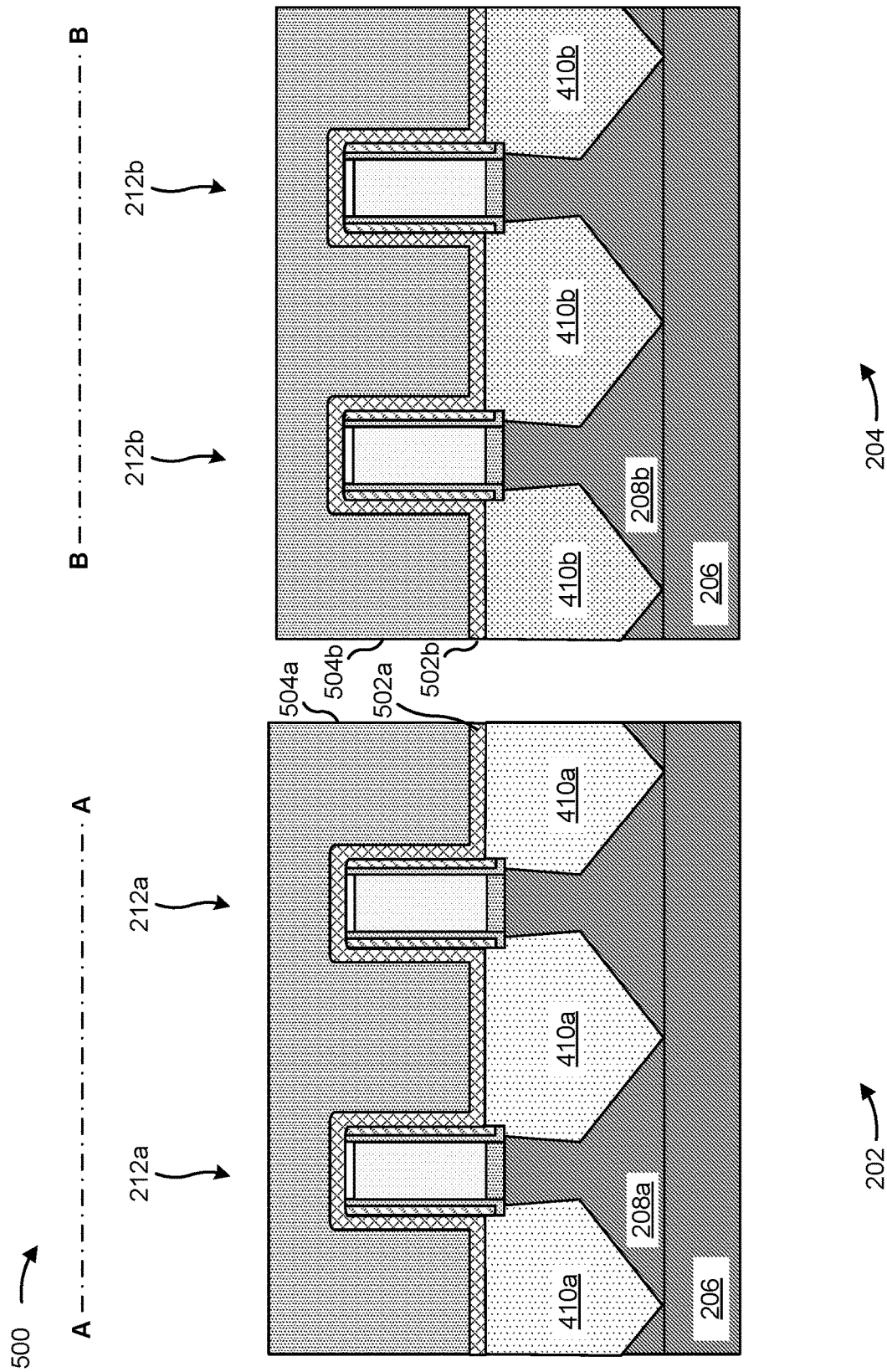

As shown in FIG. 5B, an interlayer dielectric (ILD) layer 504a is formed (e.g., by the deposition tool 102) over and/or on the CESL 502a. The ILD layer 504a fills in the areas between the dummy gate structures 212a over the p-type source/drain regions 410a. An ILD layer 504b is formed (e.g., by the deposition tool 102) over and/or on the CESL 502b. The ILD layer 504b fills in the areas between the dummy gate structures 212b. The ILD layers 504a and 504b are formed to permit a replacement gate structure process to be performed in the PMOS region 202 and in the NMOS region 204, respectively, in which metal gate structures are formed to replace the dummy gate structures 212a and 212b.

In some implementations, the ILD layer 504a is formed to a height (or thickness) such that the ILD layer 504a covers the dummy gate structures 212a. Similarly, the ILD layer 504b may be formed to a height (or thickness) such that the ILD layer 504b covers the dummy gate structures 212b. In these implementations, a subsequent CMP operation (e.g., performed by the planarization tool 110 is performed to planarize the ILD layers 504a and 504b such that the top surfaces of the ILD layers 504a and 504b are approximately at a same height as the top surfaces of the dummy gate structures 212a and 212b, respectively. The increases the uniformity of the ILD layers 504a and 504b.

Figure 5C:
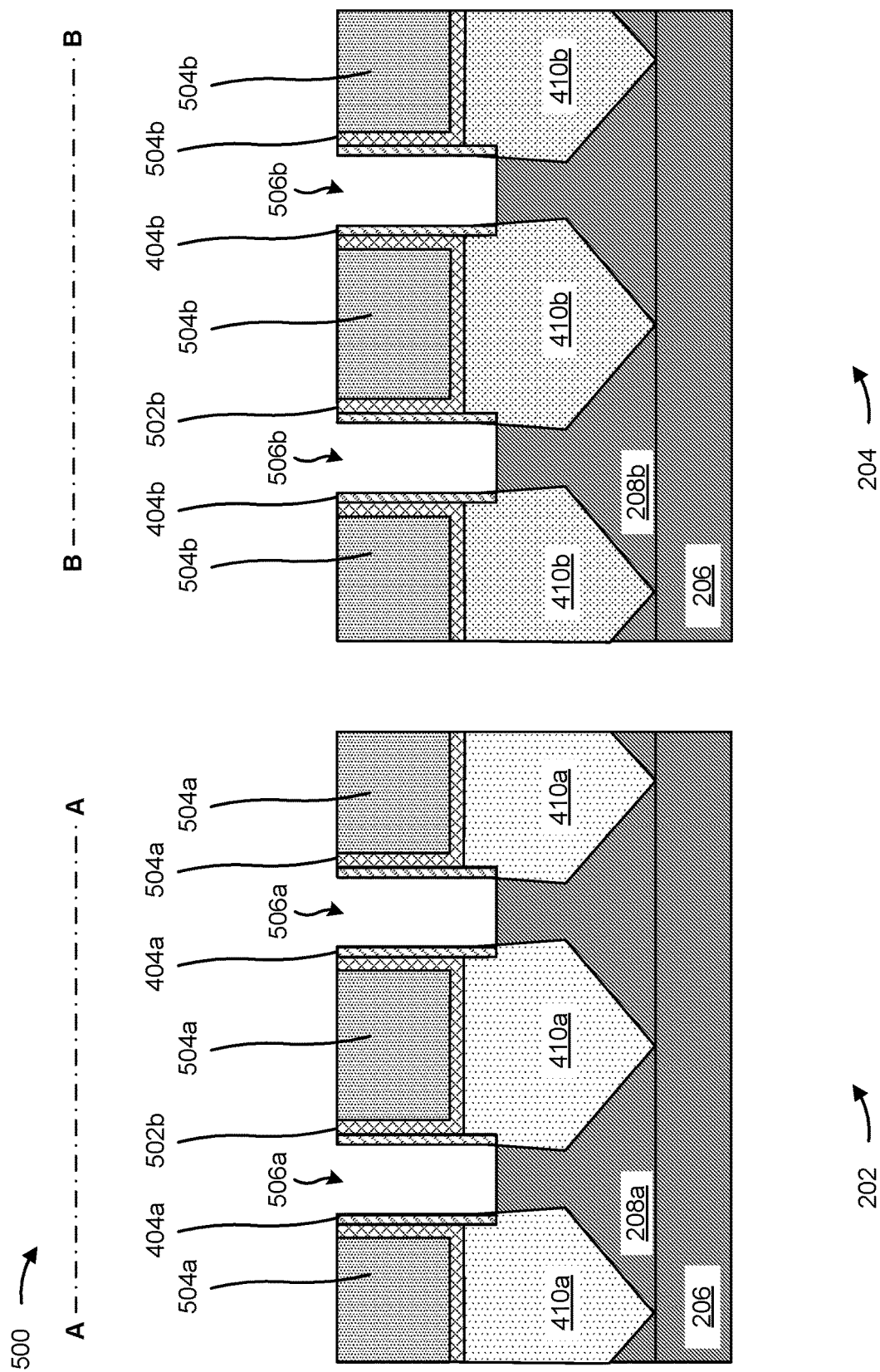

As shown in FIG. 5C, the replacement gate operation is performed (e.g., by one or more of the semiconductor processing tools 102-112) to remove the dummy gate structures 212a from the PMOS region 202 and the dummy gate structures 212b from the NMOS region 204. The removal of the dummy gate structures 212a leaves behind openings (or recesses) 506a between the bulk spacer layers 404a and between the p-type source/drain regions 410a. The removal of the dummy gate structures 212b leaves behind openings (or recesses) 506b between the bulk spacer layers 404b and between the n-type source/drain regions 410b.

Figure 5D:
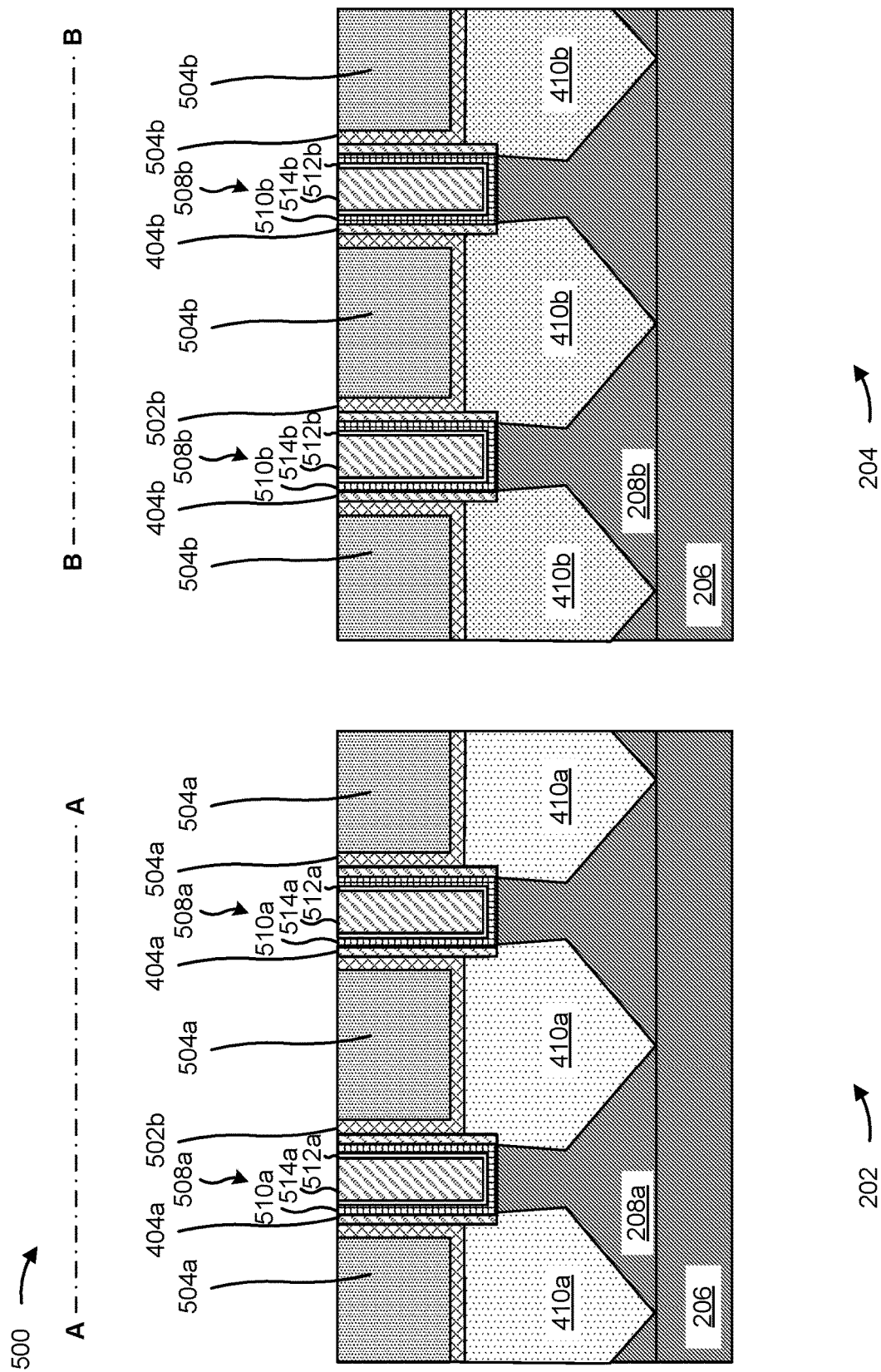

As shown in FIG. 5D, the replacement gate operation continues where deposition tool 102 and/or the plating tool 112 forms the gate structures (e.g., replacement gate structures) 508a in the openings 506a between the bulk spacer layers 404a and between the p-type source/drain regions 410a, and forms gate structures 508b in the openings 506b between the bulk spacer layers 404b and between the n-type source/drain regions 410b. The gate structures 508a and 508b may include metal gate structures, high-k gate structures, or other types of gate structures. The gate structures 508a may include an interfacial layer (not shown), a high-k dielectric layer 510a, a work function tuning layer 512a, and a metal electrode structure 514a formed therein to form a gate structure 508a. The gate structures 508b may include an interfacial layer (not shown), a high-k dielectric layer 510b, a work function tuning layer 512b, and a metal electrode structure 514b formed therein to form a gate structure 508b. In some implementations, the gate structures 508a and/or 508b may include other compositions of materials and/or layers.

As indicated above, FIGS. 5A-5D are provided as an example. Other examples may differ from what is described with regard to FIGS. 5A-5D.

FIGS. 6A-6F are diagrams of an example implementation 600 described herein. The example implementation 600 includes an example of forming dual silicide layers for the semiconductor device 200. In this way, a p-type metal silicide layer may be selectively formed over the p-type source/drain regions 410a, and an n-type metal silicide layer may be formed over the n-type source/drain regions 410b. This provides a low Schottky barrier height between the p-type metal silicide layer and the p-type source/drain regions 410a, and provides a low Schottky barrier between the n-type metal silicide layer and the n-type source/drain regions 410b. The low Schottky barrier heights provide low contact resistance (e.g., less than $1e^{-9}$ Ohm square centimeters (2 cm$^2$), for example) for both p-type source/drain regions 410a and n-type source/drain regions 410b. FIGS. 6A-6F are illustrated from the perspective of the cross-sectional plane A-A in FIG. 2 for the PMOS region 202, and from the perspective of the cross-sectional plane B-B in FIG. 2 for the NMOS region 204.

Figure 6A:
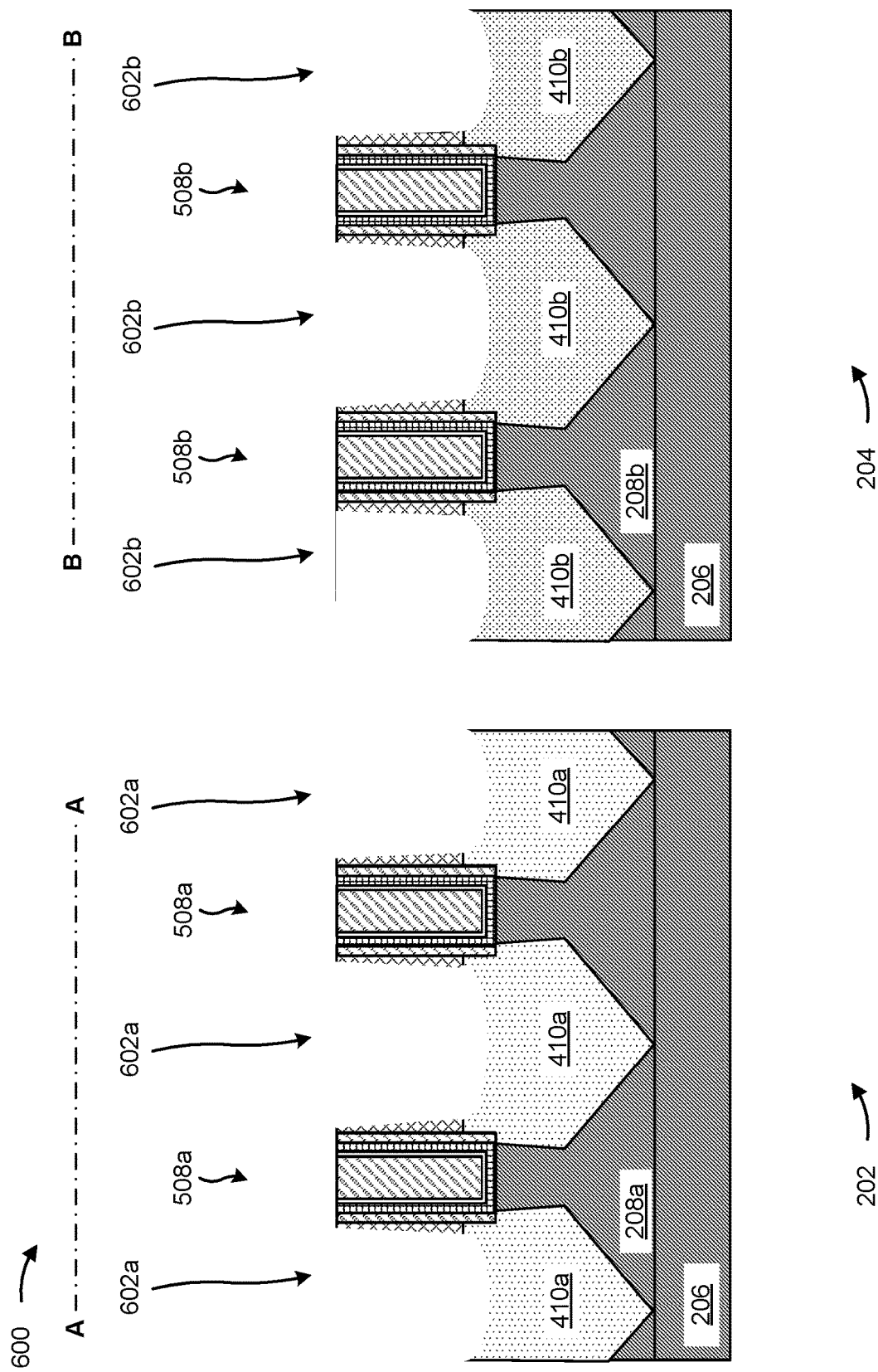

As shown in FIG. 6A, the ILD layers 504a between the gate structures 508a in the PMOS region 202 are etched to form recesses 602a between the gate structures 508a and to the p-type source/drain regions 410a. The recesses 602a may be formed in a portion of the p-type source/drain regions 410a such that recesses are formed from the top surfaces of the p-type source/drain regions 410a. Moreover, the ILD layers 504b between the gate structures 508b in the NMOS region 204 are etched to form recesses 602b between the gate structures 508b and to the n-type source/drain regions 410b. Moreover, the recesses 602b may be formed in a portion of the n-type source/drain regions 410b such that recesses are formed from the top surfaces of the n-type source/drain regions 410b.

In some implementations, a pattern in a photoresist layer is used to form the recesses 602a and 602b. In these implementations, the deposition tool 102 forms the photoresist layer on the ILD layers 504a and 504b, and on the gate structures 508a and 508b. The exposure tool 104 exposes the photoresist layer to a radiation source to pattern the photoresist layer. The developer tool 106 develops and removes portions of the photoresist layer to expose the pattern. The etch tool 108 etches into the ILD layers 504a and 504b to form the recesses 602a and 602b, respectively. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the recesses 602a and 602b based on a pattern.

Figure 6B:
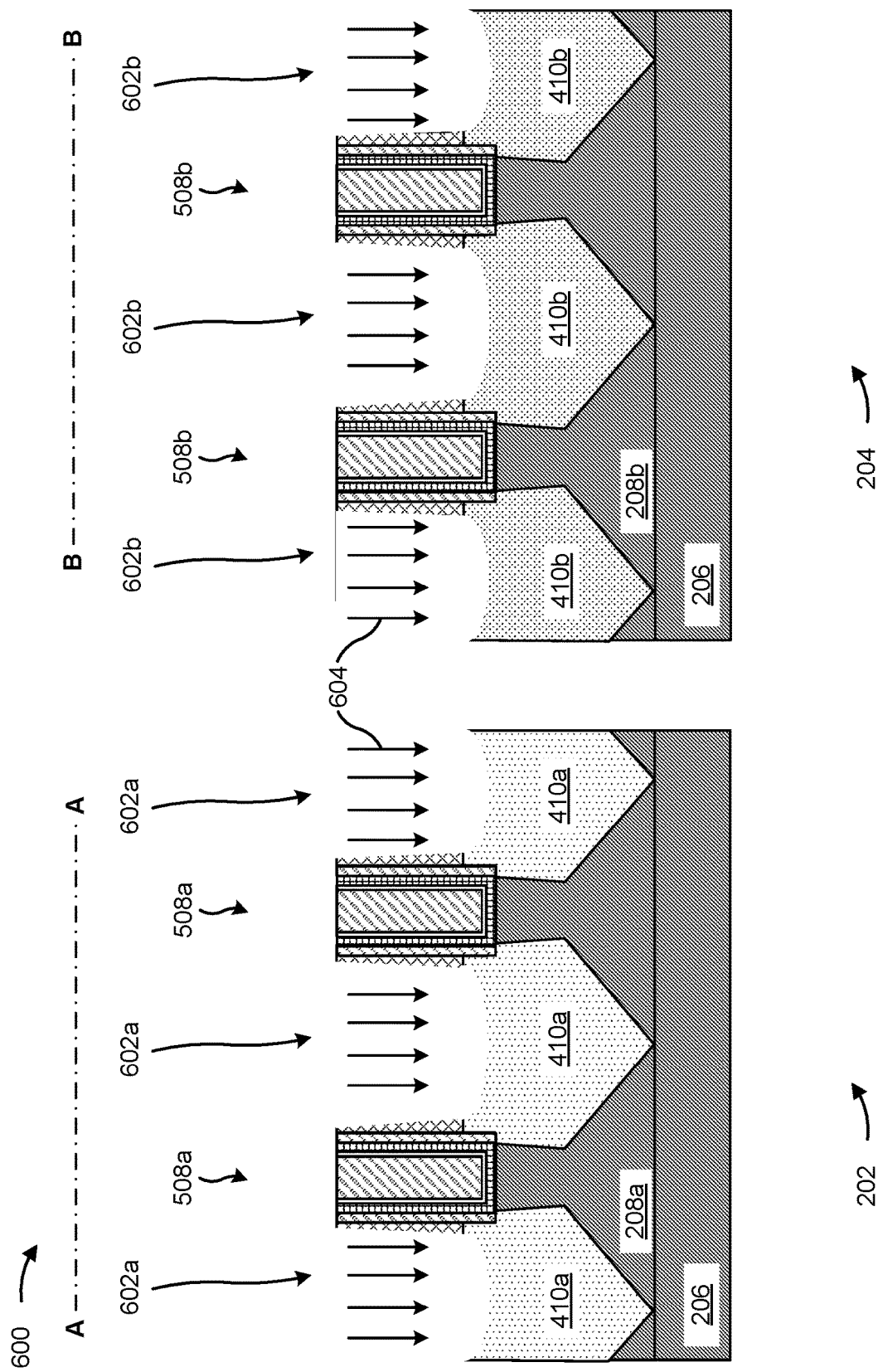

As shown in FIG. 6B, a pre-clean operation is performed to clean the surfaces in the recesses 602a and 602b. In particular, the semiconductor device 200 may be positioned in a first processing chamber of the deposition tool 102 (e.g., a pre-clean processing chamber), the first processing chamber may be pumped down to an at least partial vacuum (e.g., pressurized to a pressure that is included in a range of approximately 5 Torr to approximately 10 Torr, or to another pressure), and the surfaces in the recesses 602a and 602b are cleaned using a plasma-based and/or a chemical-based pre-clean agent 604. The pre-clean operation is performed to clean (e.g., remove) oxides and other contaminants or byproducts from the top surfaces of the p-type source/drain regions 410a and from the top surfaces of the n-type source/drain regions 410b that may have formed after the formation of the recesses 602a and 602b.

Figure 6C:
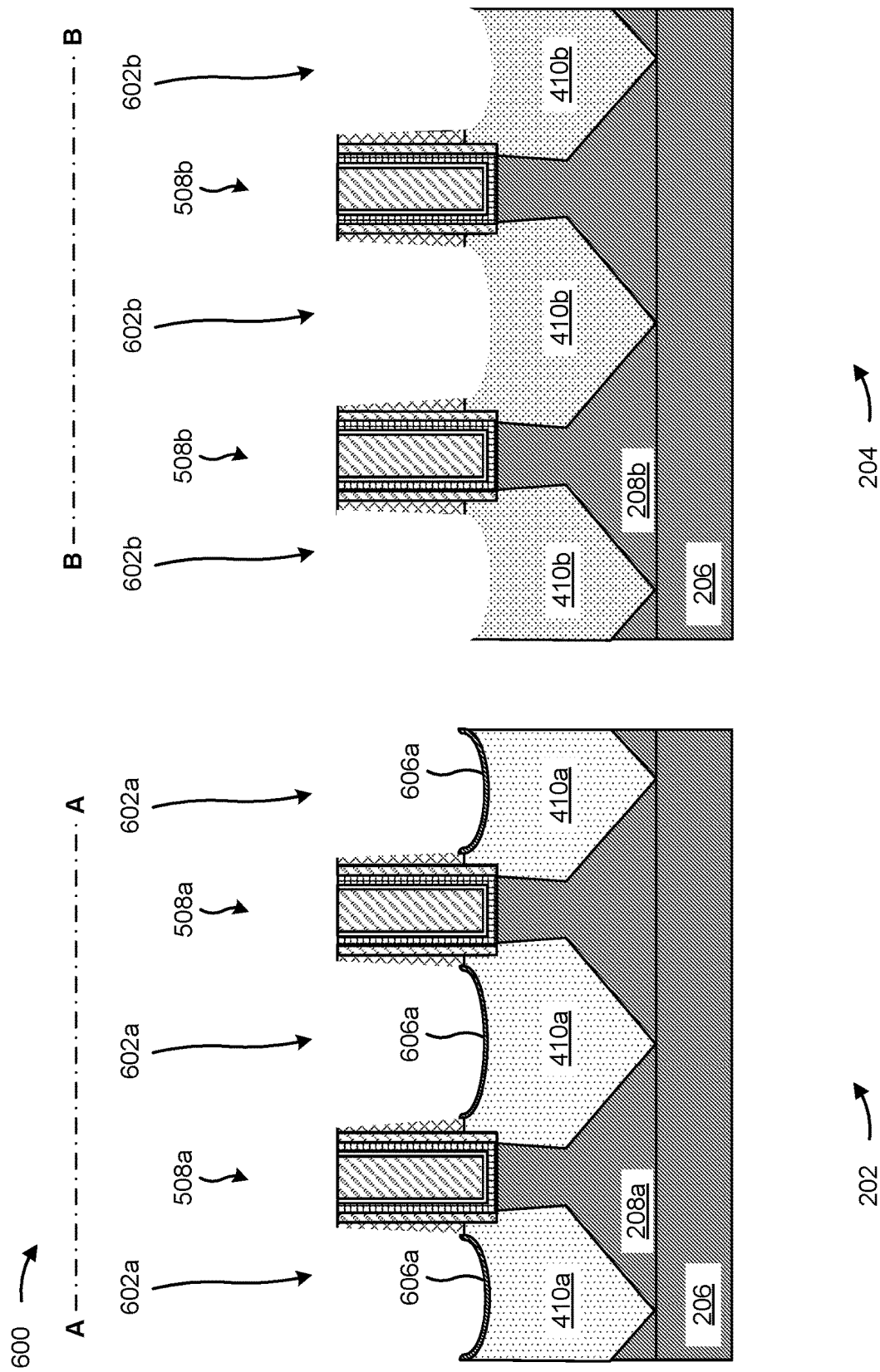

Turning to FIG. 6C, the semiconductor device 200 is transferred to a second processing chamber of the deposition tool 102 while still under the at least partial vacuum (e.g., while preserving or maintaining the at least partial vacuum) after the pre-clean operation. The wafer/die transport tool 114 transfers the semiconductor device 200 from the first processing chamber to the second processing chamber in-situ (e.g., without breaking the at least partial vacuum) such that the semiconductor device 200 (and the p-type source/drain regions 410a and the n-type source/drain regions 410b) are not exposed to atmospheric conditions, which might otherwise result in recontamination of the semiconductor device 200.

As shown in FIG. 6C, the deposition tool 102 forms a p-type metal silicide layer 606a on the p-type source/drain regions 410a in the second processing chamber while under the at least partial vacuum (e.g., without breaking at least the partial vacuum). Accordingly, the deposition tool 102 forms the p-type metal silicide layer 606a on the p-type source/drain regions 410a in-situ.

As further shown in FIG. 6C, the deposition tool 102 forms a p-type metal silicide layer 606a on the p-type source/drain regions 410a by a selective deposition operation. In particular, the deposition tool 102 forms the p-type metal silicide layer 606a on the top surfaces of the p-type source/drain regions 410a in the recesses in the top surfaces of the p-type source/drain regions 410a. The selective deposition operation is selective in that the p-type metal silicide layer 606a is selectively formed on the p-type source/drain regions 410a and not on the n-type source/drain regions 410b. The selectivity is achieved without the use of a mask (e.g., a photomask or a hard mask) over the n-type source/drain regions 410b as a result of the p-type metal precursor that is used to form the p-type metal silicide layer 606a, and as a result of the selective deposition operation techniques used to form the p-type metal silicide layer 606a. The details of the p-type metal precursors that are used to form the p-type metal silicide layer 606a, and the details of the selective deposition operation techniques used to form the p-type metal silicide layer 606a, are described in connection with FIGS. 10A-10D.

In some implementations, the p-type metal silicide layer 606a includes a ruthenium silicide (e.g., $Ru_xSi_y$, such as $Ru_2Si$ or $Ru_2Si_3$, among other examples), a nickel silicide ($Ni_xSi_y$), an iridium silicide ($Ir_xSi_y$), a tungsten silicide ($W_xSi_y$), a platinum silicide ($Pt_xSi_y$), a palladium silicide ($Pd_xSi_y$), or another p-type metal silicide material having a low p-type Schottky barrier height (e.g., a low hole Schottky barrier height). In some implementations, the p-type metal silicide layer 606a includes a low p-type Schottky barrier height, such as a Schottky barrier height included in a range of approximately 0.65 electron volts (eV) to approximately 0.77 eV to achieve a low contact resistance between the p-type metal silicide layer 606a and the p-type source/drain regions 410a. In some implementations, the p-type metal silicide layer 606a includes a low resistivity that is included in a range of approximately 10 micro Ohm centimeters ($\mu\Omega cm$) to approximately 1000 $\rho\Omega cm$.

Figure 6D:
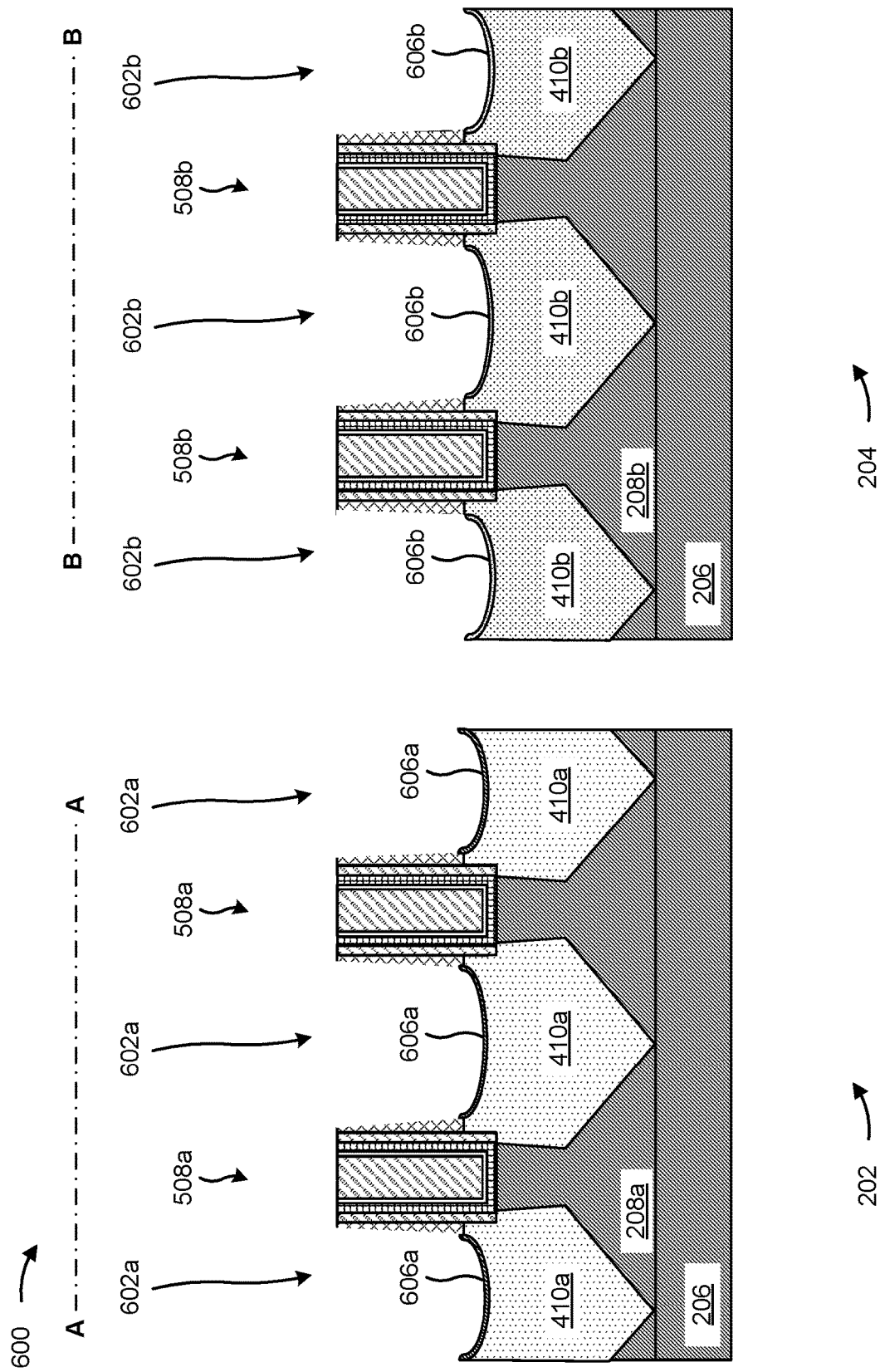

Turning to FIG. 6D, the semiconductor device 200 is transferred to a third processing chamber of the deposition tool 102 while still under the at least partial vacuum (e.g., while preserving or maintaining the at least partial vacuum) after the p-type metal silicide layer 606a is formed. The wafer/die transport tool 114 transfers the semiconductor device 200 from the second processing chamber to the third processing chamber in-situ (e.g., without breaking the at least partial vacuum) such that the semiconductor device 200 (and the p-type metal silicide layer 606a and the n-type source/drain regions 410b) are not exposed to atmospheric conditions, which might otherwise result in recontamination of the semiconductor device 200. This enables the semiconductor device 200 to be transferred to the third processing chamber without forming a metal barrier layer on the p-type metal silicide layer 606a to protect the p-type metal silicide layer 606a from atmospheric contamination, which reduces the process complexity in forming the semiconductor device 200 and reduces the likelihood of yield loss in forming the semiconductor device 200.

As shown in FIG. 6D, the deposition tool 102 forms an n-type metal silicide layer 606b on the n-type source/drain regions 410b in the third processing chamber while under the at least partial vacuum (e.g., without breaking the at least the partial vacuum). Accordingly, the deposition tool 102 forms the n-type metal silicide layer 606b on the n-type source/drain regions 410b in-situ. This enables the n-type metal silicide layer 606b to be formed without performing an intervening (second) pre-clean operation between formation of the p-type metal silicide layer 606a and formation of the n-type metal silicide layer 606b, which reduces the likelihood of and/or reduces the amount of plasma damage to the n-type source/drain regions 410b and the sidewalls in the recesses 602b. This minimizes and/or prevents critical dimension enlargement of source/drain contacts that are subsequently formed to the n-type source/drain regions 410b.

As further shown in FIG. 6D, the deposition tool 102 forms the n-type metal silicide layer 606b by a selective deposition operation. In particular, the deposition tool 102 forms the n-type metal silicide layer 606b on the top surfaces of the n-type source/drain regions 410b in the recesses in the top surfaces of the n-type source/drain regions 410b. The selective deposition operation is selective in that the n-type metal silicide layer 606b is selectively formed on the n-type source/drain regions 410b and not on the p-type metal silicide layer 606a over the p-type source/drain regions 410a. The selectivity is achieved without the use of a mask (e.g., a photomask or a hard mask) over the p-type metal silicide layer 606a as a result of the use of a halogen gas to passivate the p-type source/drain regions 410a and/or the n-type metal precursor that is used to form the n-type metal silicide layer 606b. The halogen gas may passivate the germanium (Ge) adsorption sites of the p-type source/drain regions 410a such that adsorption of the n-type metal precursor is resisted. Moreover, the n-type metal precursor (e.g., a titanium chloride ($TiCl_x$) or another type of n-type metal precursor) preferentially adsorbs onto silicon (Si) adsorption sites of the n-type source/drain regions 410b relative to the germanium (Ge) adsorption sites of the p-type source/drain regions 410a, which further promotes the selective deposition of the n-type metal silicide layer 606b on the n-type source/drain regions 410b.

In some implementations, the n-type metal silicide layer 606b includes a titanium silicide (e.g., $Ti_xSi_y$), a ytterbium silicide ($Yb_xSi_y$), an erbium silicide ($Er_xSi_y$), a lutetium silicide ($Lu_xSi_y$), a gadolinium silicide ($Gd_xSi_y$), a zirconium silicide ($Zr_xSi_y$), a molybdenum silicide ($Mo_xSi_y$), a tantalum silicide (e.g., $Ta_xSi_y$), or another n-type metal silicide material having a low n-type Schottky barrier height (e.g., a low electron Schottky barrier height). In some implementations, the n-type metal silicide layer 606b includes a low n-type Schottky barrier height, such as a Schottky barrier height included in a range of approximately 0.5 eV to approximately 0.6 eV to achieve a low contact resistance between the n-type metal silicide layer 606b and the n-type source/drain regions 410b. In some implementations, the n-type metal silicide layer 606b includes a low resistivity that is included in a range of approximately 400 μΩcm to approximately 600 μΩcm.

Figure 6E:
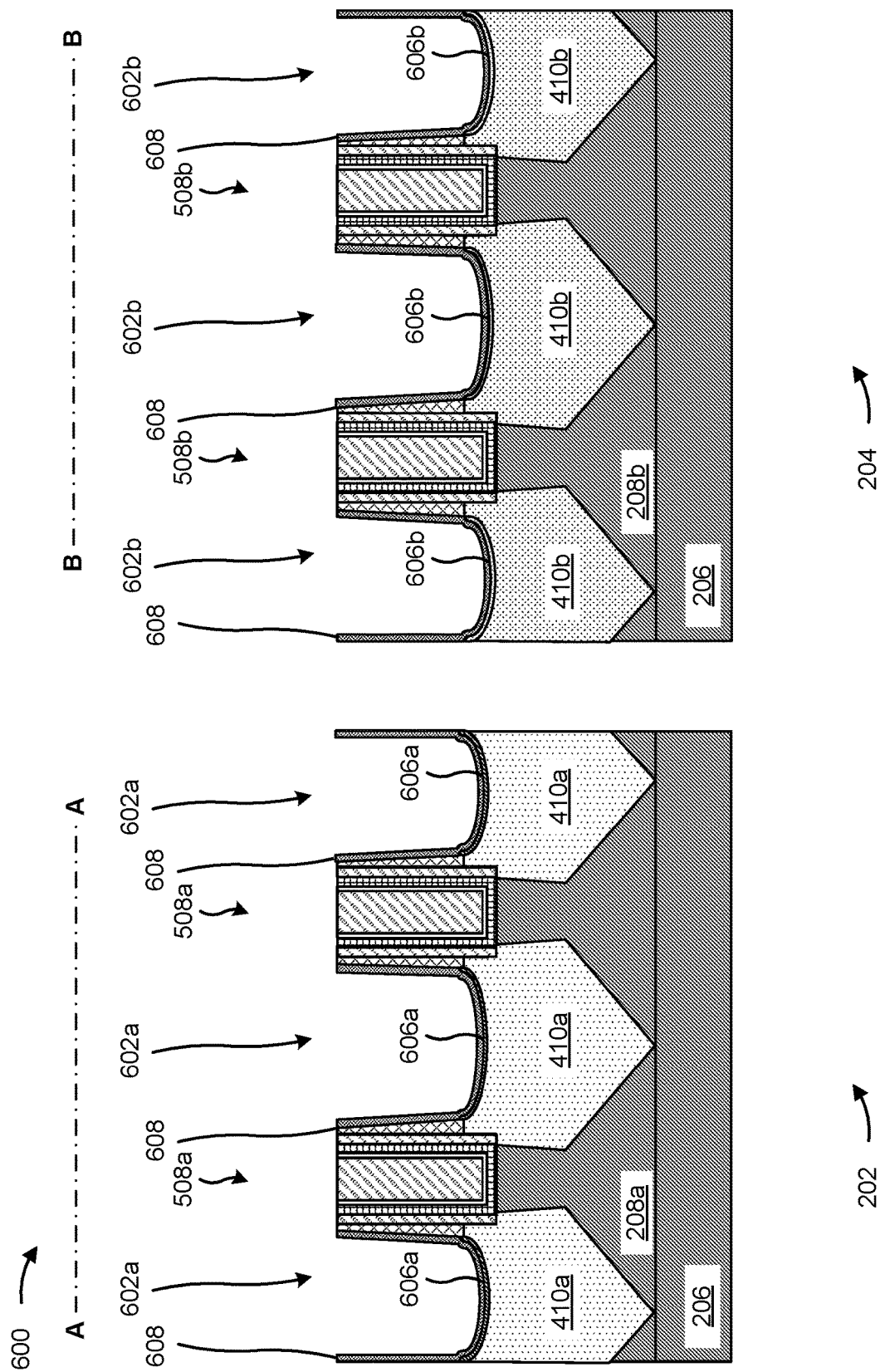

Turning to FIG. 6E, the semiconductor device 200 is transferred to a fourth processing chamber of the deposition tool 102 while still under the at least partial vacuum (e.g., while preserving or maintaining the at least partial vacuum) after the n-type metal silicide layer 606b is formed. The wafer/die transport tool 114 transfers the semiconductor device 200 from the third processing chamber to the fourth processing chamber in-situ (e.g., without breaking the at least partial vacuum) such that the semiconductor device 200 (and the p-type metal silicide layer 606a and the n-type metal silicide layer 606b) are not exposed to atmospheric conditions, which might otherwise result in recontamination of the semiconductor device 200. This enables the semiconductor device 200 to be transferred to the fourth processing chamber without forming a metal barrier layer on the p-type metal silicide layer 606a and on the n-type metal silicide layer 606b to protect the p-type metal silicide layer 606a and the n-type metal silicide layer 606b from atmospheric contamination, which reduces the process complexity in forming the semiconductor device 200 and reduces the likelihood of yield loss in forming the semiconductor device 200.

As shown in FIG. 6E, the deposition tool 102 forms a metal barrier layer 608 in the recesses 602a and 602b while in the fourth processing chamber and while under the at least partial vacuum (e.g., without breaking the at least the partial vacuum). Accordingly, the deposition tool 102 forms the metal barrier layer 608 in-situ. This enables the metal barrier layer 608 to be formed without performing an intervening pre-clean operation between formation of the n-type metal silicide layer 606b and formation of the metal barrier layer 608, which reduces the likelihood of and/or reduces the amount of plasma damage to the p-type source/drain regions 410a, the n-type source/drain regions 410b, and the sidewalls in the recesses 602b. This minimizes and/or prevents critical dimension enlargement of source/drain contacts that are subsequently formed to the p-type source/drain regions 410a and to the n-type source/drain regions 410b.

Moreover, this enables the deposition tool 102 to form the metal barrier layer 608 over and/or on the p-type metal silicide layer 606a and over and/or on the n-type metal silicide layer 606b in the same deposition operation (e.g., as opposed to separate deposition operations), which further reduces process complexity of forming the semiconductor device 200. The metal barrier layer 608 may be formed to a thickness that is included in a range of approximately 2 angstroms to provide sufficient oxidation protection to approximately 5 angstroms to provide sufficiently low resistivity. However, other values for the thickness of the metal barrier layer 608 are within the scope of the present disclosure.

As further shown in FIG. 6E, the deposition tool 102 forms the metal barrier layer 608 on the p-type metal silicide layer 606a, on the sidewalls of the recesses 602a, and over the p-type source/drain regions 410a in the recesses 602a. Similarly, the deposition tool 102 forms the metal barrier layer 608 on the n-type metal silicide layer 606b, on the sidewalls of the recesses 602b, and over the n-type source/drain regions 410b in the recesses 602b. The metal barrier layer 608 may include a metal, a metal nitride, or another type of metal barrier layer material. Examples include a titanium nitride ($Ti_xN_y$), a ruthenium nitride ($Ru_xN_y$), a nickel nitride ($Ni_xN_y$), a titanium silicon nitride ($Ti_xSi_yN_z$), a ruthenium silicon nitride ($Ru_xSi_yN_z$), and/or a nickel silicon nitride ($Ni_xSi_yN_z$), among other examples. The deposition tool 102 may form the metal barrier layer 608 by an ALD operation, a CVD operation, and/or another type of deposition operation.

Figure 6F:
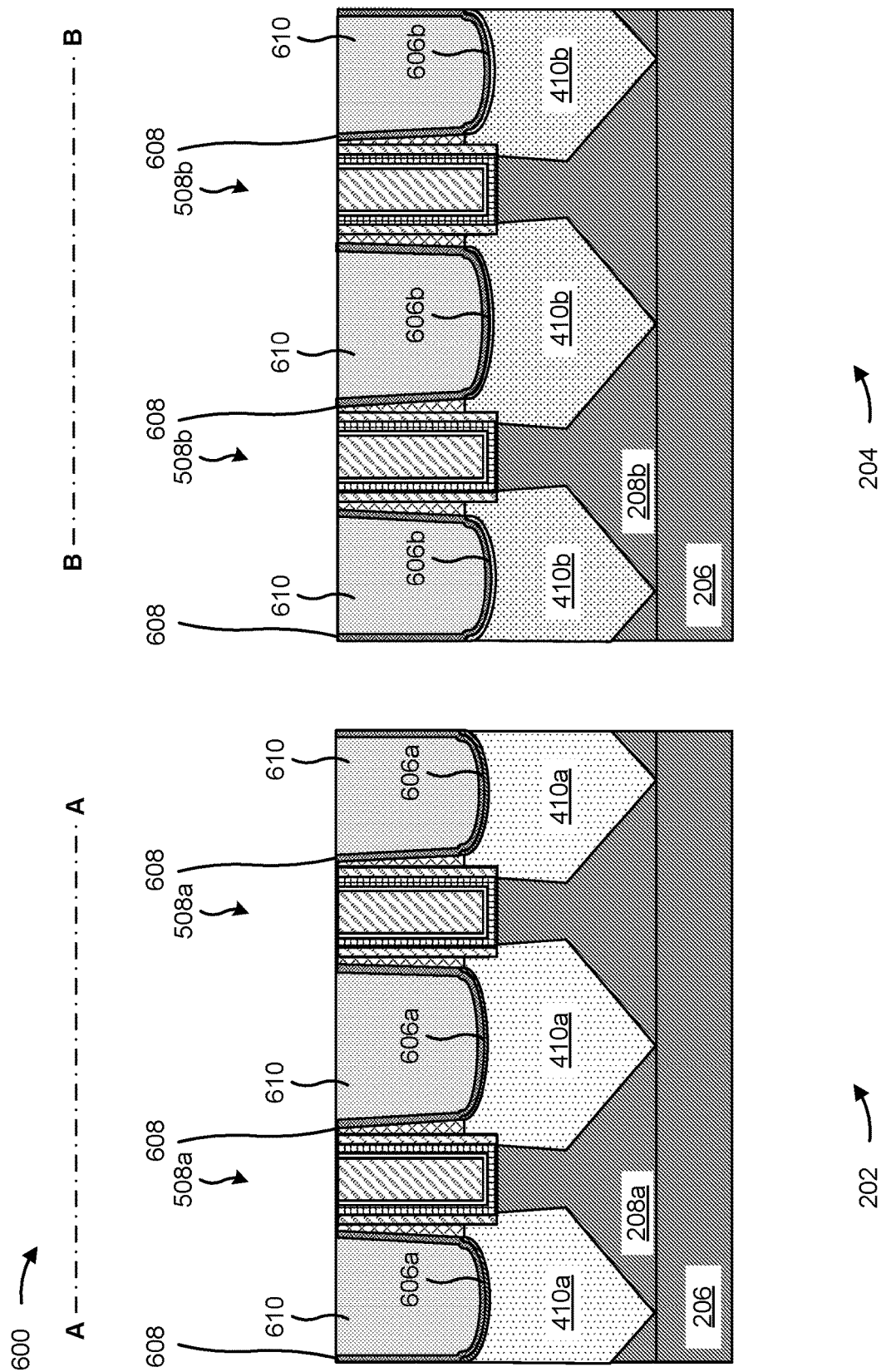

As shown in FIG. 6F, source/drain contacts 610 (e.g., metal source/drain contacts or MDs) are formed in the PMOS region 202 and in the NMOS region 204. In particular, a first plurality of source/drain contacts 610 are formed in the recesses 602a between the gate structures 508a and over the p-type source/drain regions 410a in the recesses 602a. Moreover, the first plurality of source/drain contacts 610 are formed in the recesses 602a over and/or on the metal barrier layer 608, and over and/or on the p-type metal silicide layer 606a. A second plurality of source/drain contacts 610 are formed in the recesses 602b between the gate structures 508b and over the n-type source/drain regions 410b in the recesses 602b. Moreover, the second plurality of source/drain contacts 610 are formed in the recesses 602b over and/or on the metal barrier layer 608, and over and/or on the n-type metal silicide layer 606b. The deposition tool 102 and/or the plating tool 112 deposits the source/drain contacts 610 by a CVD technique, a PVD technique, an ALD technique, an electroplating technique, another deposition technique described above in connection with FIG. 1, and/or a deposition technique other than as described above in connection with FIG. 1.

As indicated above, FIGS. 6A-6F are provided as an example. Other examples may differ from what is described with regard to FIGS. 6A-6F. In some implementations, the processes and/or techniques described in connection with FIGS. 6A-6F may be performed in a greater quantity of processing chambers or a fewer quantity of processing chambers.

Figure 7:
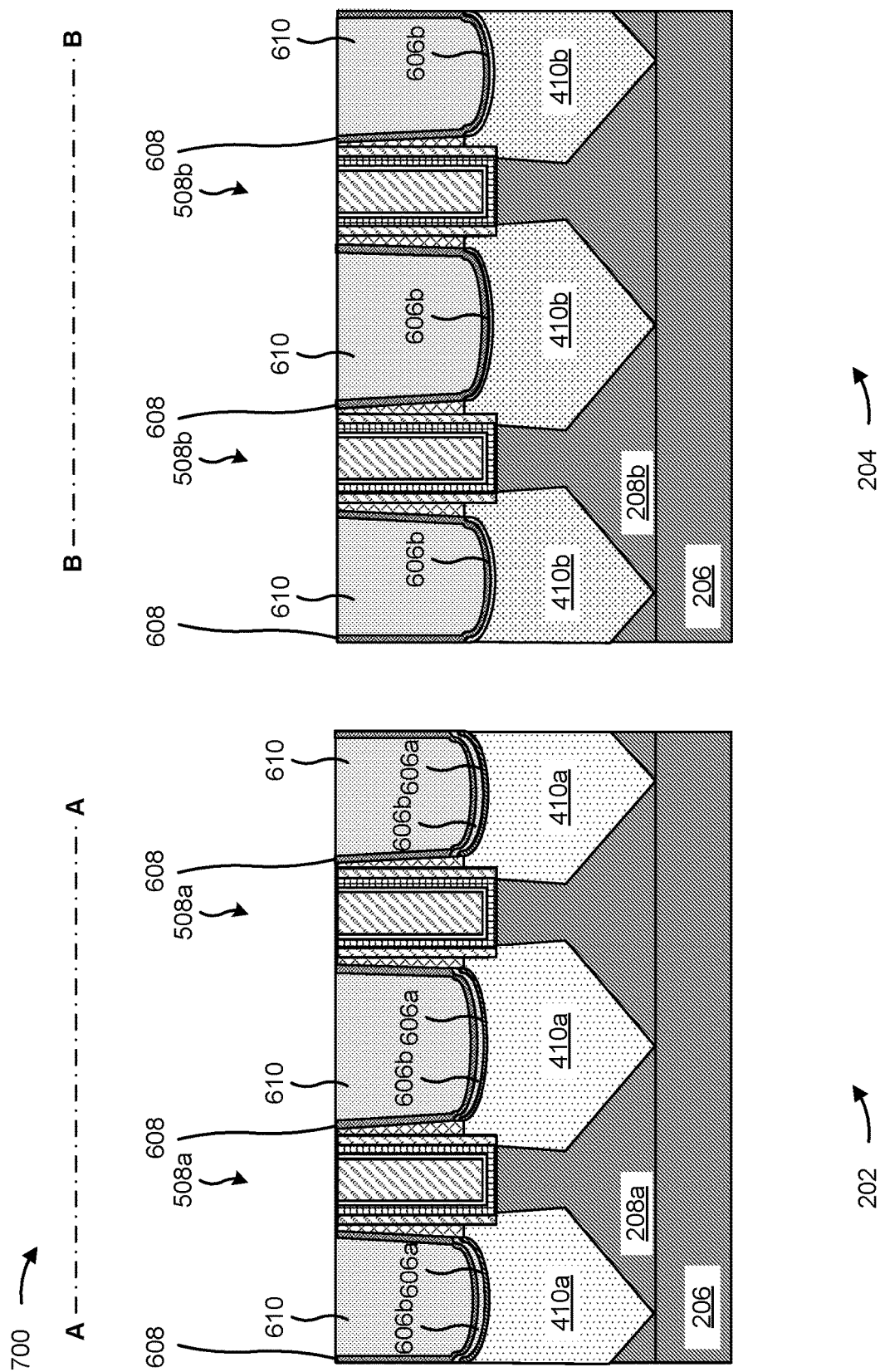
FIGS. 7, 8, and 9 are diagrams of example implementations of the regions of an example semiconductor device of FIG. 2.

FIG. 7 is a diagram of an example implementation 700 of the semiconductor device 200 described herein. In some cases, the p-type metal that is included in the p-type metal silicide layer 606a may result in a relatively high diffusivity (e.g., approximately $6e^{-13}$ meters squared per second ($m^2/s$) to approximately $4e^{-10}$ $m^2/s$, for example) and/or a relatively high silicon consumption (e.g., approximately 1.83 to approximately 2.21, for example) for the p-type metal silicide layer 606a. Accordingly, and a shown in the example implementation 700 in FIG. 7, the n-type metal silicide layer 606b may be formed (e.g., by the deposition tool 102) in a non-selective deposition operation such that the n-type metal silicide layer 606b is included between the p-type metal silicide layers 606a and the source/drain contacts 610 in the PMOS region 202 of the semiconductor device 200. In this way, the p-type metal silicide layer 606a may be included to reduce the p-type Schottky barrier height (and thus, the contact resistance) between the p-type source/drain regions 410a and the source/drain contacts 610, while the n-type metal silicide layer 606b may be included to reduce, limit, and/or resist the consumption of silicon in the p-type source/drain regions 410a by the p-type metal silicide layer 606a. The n-type metal silicide layer 606b may also increase the thermal stability of the p-type metal silicide layer 606a.

As indicated above, FIG. 7 is provided as an example. Other examples may differ from what is described with regard to FIG. 7.

Figure 8:
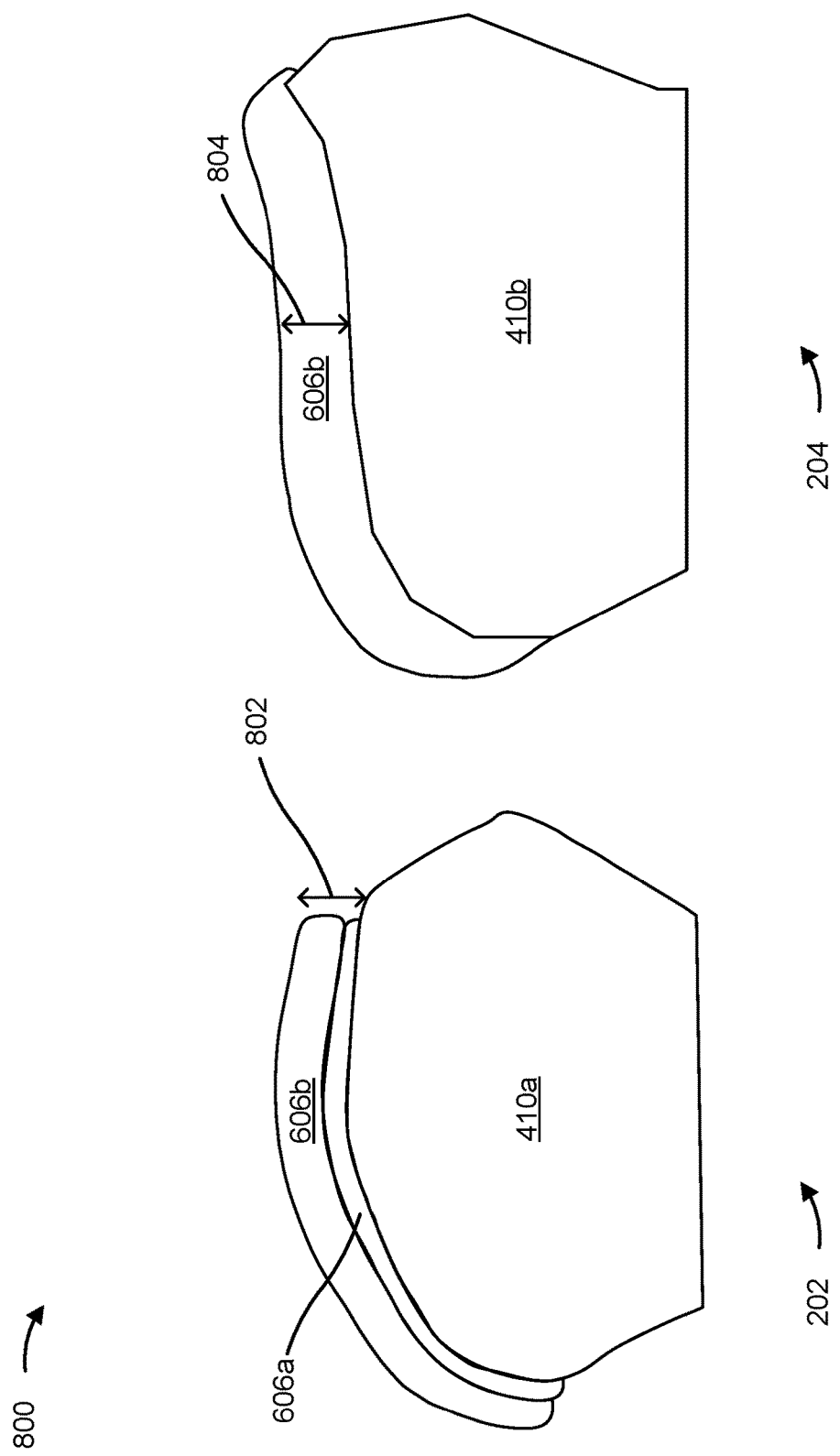

FIG. 8 is a diagram of an example implementation 800 of the semiconductor device 200 described herein. In particular, the example implementation 800 includes an example in which the PMOS region 202 includes the p-type metal silicide layer 606a on the p-type source/drain region 410a and the n-type metal silicide layer 606b on the p-type metal silicide layer 606a and on the n-type source/drain region 410b.

In some implementations, a combined thickness 802 of the p-type metal silicide layer 606a and the n-type metal silicide layer 606b on the p-type source/drain region 410a may be included in a range of approximately 25 angstroms to approximately 85 angstroms to provide sufficient thermal stability and low metal resistivity for the metal silicide layers in the PMOS region 202 of the semiconductor device 200. However, other values for the combined thickness 802 are within the scope of the present disclosure. In some implementations, the thickness of the p-type metal silicide layer 606a is included in a range of approximately 5 angstroms to approximately 50 angstroms to minimize conversion of the p-type metal silicide layer interface to the n-type material of the n-type metal silicide layer 606b, to minimize silicon consumption of the p-type source/drain region 410a, to minimize junction spiking, and to minimize out-diffusion of the p-type metal silicide layer 606a. However, other values for the thickness of the p-type metal silicide layer 606a are within the scope of the present disclosure. In some implementations, a thickness 804 of the n-type metal silicide layer 606b on the n-type source/drain region 410b may be included in a range of approximately 35 angstroms to approximately 75 angstroms. However, other values for the thickness 804 are within the scope of the present disclosure. In some implementations, a ratio of the combined thickness 802 to the thickness 804 is included in a range of approximately 1:3 to approximately 17:7 such that the thicknesses of the p-type metal silicide layer 606a and the n-type metal silicide layer 606b to optimize the performance for the p-type source/drain region 410a and for the n-type source/drain region and for selective silicide formation for different semiconductor processing nodes.

In some implementations, the thickness of the n-type metal silicide layer 606b on the n-type source/drain region 410b is greater than a thickness of the p-type metal silicide layer 606a on the p-type source/drain region 410a. This enables the n-type metal silicide layer 606b to also be formed over the p-type source/drain region 410a and enables independent dual silicide thickness optimization.

As indicated above, FIG. 8 is provided as an example. Other examples may differ from what is described with regard to FIG. 8.

Figure 9:
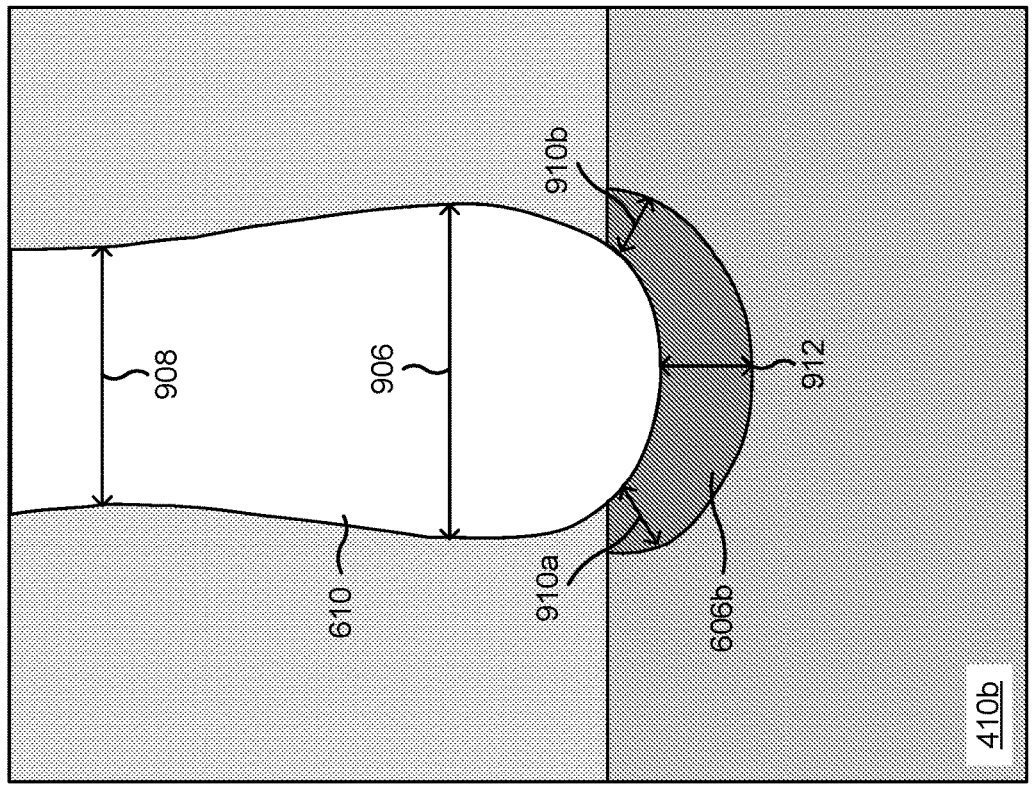
Figure 9:
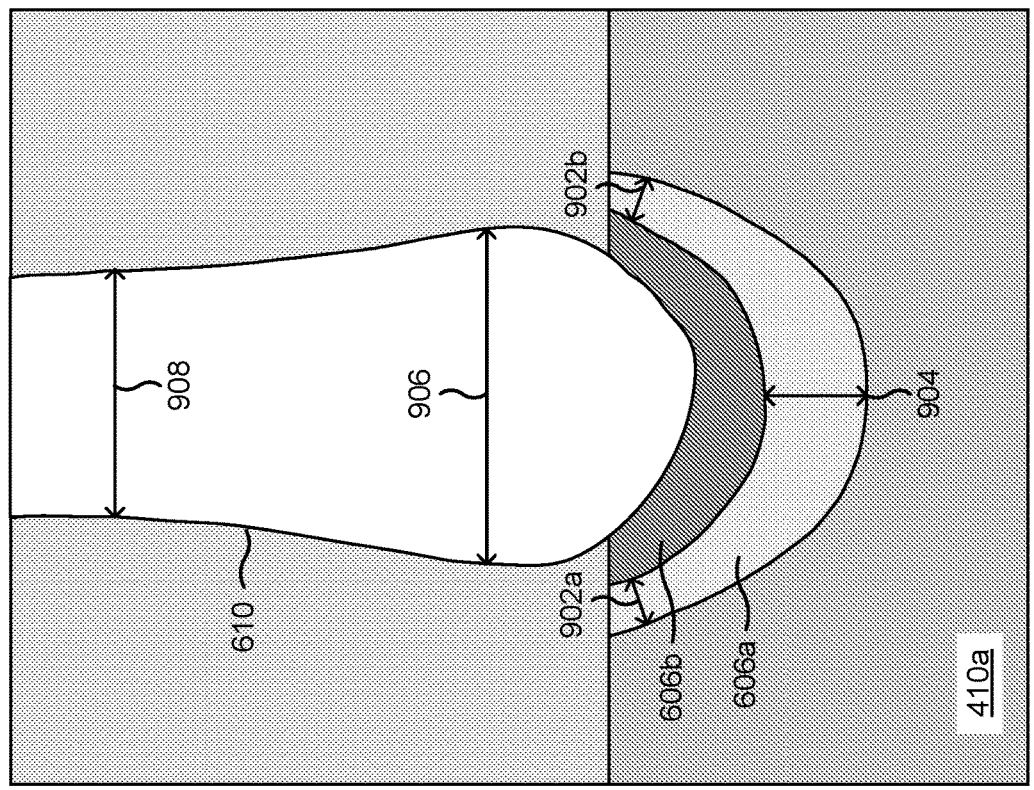

FIG. 9 is a diagram of an example implementation 900 of the semiconductor device 200 described herein. In particular, the example implementation 900 includes an example in which the PMOS region 202 includes the p-type metal silicide layer 606a on the p-type source/drain region 410a and the n-type metal silicide layer 606b on the p-type metal silicide layer 606a and on the n-type source/drain region 410b. As further shown in the example implementation 900, source/drain contacts 610 are included above the p-type source/drain region 410a and above the n-type source/drain region 410b.

As shown in FIG. 9, the p-type metal silicide layer 606a may include a non-uniform thickness, where side thicknesses 902a and 902b are less than a center thickness 904 of the p-type metal silicide layer 606a. In some implementations, a ratio of the center thickness 904 to the side thicknesses 902a and 902b is included in a range of approximately 2.15:1 to approximately 1.12:1. However, other values for the ratio are within the scope of the present disclosure. As shown in FIG. 9, the n-type metal silicide layer 606b over the n-type source/drain region 410b may include a non-uniform thickness, where side thicknesses 910a and 910b are less than a center thickness 912 of the n-type metal silicide layer 606b. In some implementations, a ratio of the center thickness 912 to the side thicknesses 910a and 910b is included in a range of approximately 2.51:1 to approximately 1.1:1. However, other values for the ratio are within the scope of the present disclosure.

As further shown in FIG. 9, in some implementations, the source/drain contacts 610 include a non-uniform profile between a top surface of the source/drain contacts 610 and a bottom surface (e.g., orientated toward the source/drain regions) of the source/drain contacts 610. As an example, the source/drain contacts 610 may include a greater bottom width 906 toward the bottom surfaces of the source/drain contacts 610 relative to a top width 908 toward the top surfaces of the source/drain contacts 610. In some implementations, a ratio of the bottom width 906 of the source/drain contact 610 above the p-type source/drain region 410a to the side thicknesses 902a and 902b of the p-type metal silicide layer 606a is included in a range of approximately 8.6:1 to approximately 6.8:1. However, other values for the ratio are within the scope of the present disclosure. In some implementations, a ratio of the top width 908 of the source/drain contact 610 above the p-type source/drain region 410a to the side thicknesses 902a and 902b of the p-type metal silicide layer 606a is included in a range of approximately 6.25:1 to approximately 5:1. However, other values for the ratio are within the scope of the present disclosure.

In some implementations, a ratio of the bottom width 906 of the source/drain contact 610 above the p-type source/drain region 410a to the center thickness 904 of the p-type metal silicide layer 606a is included in a range of approximately 5.9:1 to approximately 4:1. However, other values for the ratio are within the scope of the present disclosure. In some implementations, a ratio of the top width 908 of the source/drain contact 610 above the p-type source/drain region 410*a* to the center thickness 904 of the p-type metal silicide layer 606*a* is included in a range of approximately 4.28:1 to approximately 2.9:1. However, other values for the ratio are within the scope of the present disclosure.

In some implementations, a ratio of the bottom width 906 of the source/drain contact 610 above the n-type source/drain region 410*b* to the side thicknesses 910*a* and 910*b* of the n-type metal silicide layer 606*b* over the n-type source/drain region 410*b* is included in a range of approximately 12:1 to approximately 5.25:1. However, other values for the ratio are within the scope of the present disclosure. In some implementations, a ratio of the top width 908 of the source/drain contact 610 above the n-type source/drain region 410*b* to the side thicknesses 910*a* and 910*b* of the n-type metal silicide layer 606*b* is included in a range of approximately 9.14:1 to approximately 4:1. However, other values for the ratio are within the scope of the present disclosure.

In some implementations, a ratio of the bottom width 906 of the source/drain contact 610 above the n-type source/drain region 410*b* to the center thickness 912 of the n-type metal silicide layer 606*b* is included in a range of approximately 5.14:1 to approximately 4.75:1. However, other values for the ratio are within the scope of the present disclosure. In some implementations, a ratio of the top width 908 of the source/drain contact 610 above the n-type source/drain region 410*b* to the center thickness 912 of the n-type metal silicide layer 606*b* is included in a range of approximately 4:1 to approximately 3.63:1. However, other values for the ratio are within the scope of the present disclosure.

As indicated above, FIG. 9 is provided as an example. Other examples may differ from what is described with regard to FIG. 9.

FIGS. 10A-10D are diagrams of an example implementation 1000 described herein. The example implementation 1000 includes an example chemical reaction in which a ruthenium (Ru) precursor 1002 is bonded to germanium (Ge) sites 1004 of a p-type source/drain region 410*a* on the semiconductor device 200 to form a p-type metal silicide layer 606*a* on the p-type source/drain region 410*a*. In particular, the example implementation 1000 describes the selective dual silicide process in which the p-type metal silicide layer 606*a* is selectively formed on the p-type source/drain region 410*a* and not on n-type source/drain regions 410*b*.

Figure 10A:
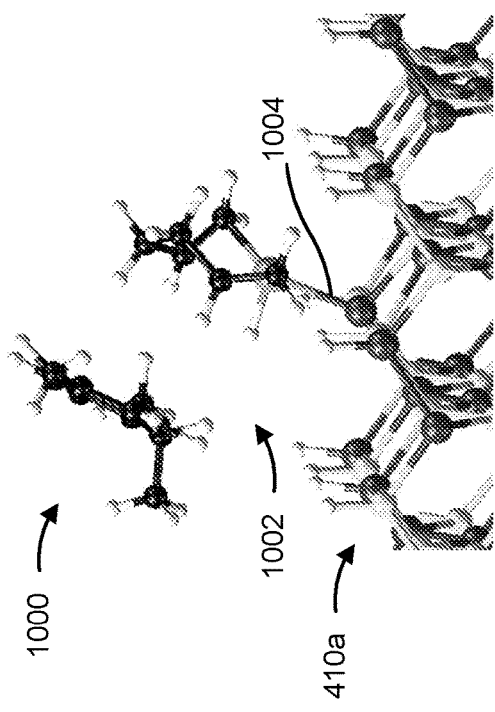
FIGS. 10A-10D, 11A, 11B, 12A, and 12B are diagrams of one or more example implementations described herein.

Turning to FIG. 10A, the deposition tool 102 performs a deposition operation in which the deposition tool 102 provides a flow of the ruthenium precursor 1002 into a processing chamber of the deposition tool 102. In some implementations, a carrier gas such as argon (Ar) or nitrogen ($N_2$), among other examples, may be used to carry and/or provide the ruthenium precursor 1002 into the processing chamber.

The ruthenium precursor 1002 may include ruthenium atoms and one or more types of ligands. As an example, the ruthenium precursor 1002 may include a metal organic ruthenium precursor with a relatively high vapor pressure. As another example, the ruthenium precursor 1002 may include a metal-organic and halide (e.g., fluorine (F), chlorine (Cl)) based precursor. The ruthenium precursor 1002 is selective to silicon germanium or other p-type semiconductors relative to silicon or n-type semiconductors to facilitate the selective deposition of the p-type metal silicide layer 606*a* on the p-type source/drain region 410*a* (e.g., and not on n-type source/drain regions 410*b*). Examples of the ruthenium precursor 1002 include Ru-p-Cymene, Cyclohexene (Ru-pCC, $C_{10}H_{14}RuC_6H_{10}$) (e.g., which includes a first ligand (L1) of p-Cymene and a second ligand (L2) of Cyclohexene), Rudense® (2,4-(dimethylpentadienyl)(ethylcyc lopentadienyl)Ru) (e.g., which includes a first ligand (L1) of dimethyloxopentadienyl (DMOPD) and a second ligand (L2) of lopentadienyl (EtCp)), and/or another type of ruthenium precursor.

Figure 10B:
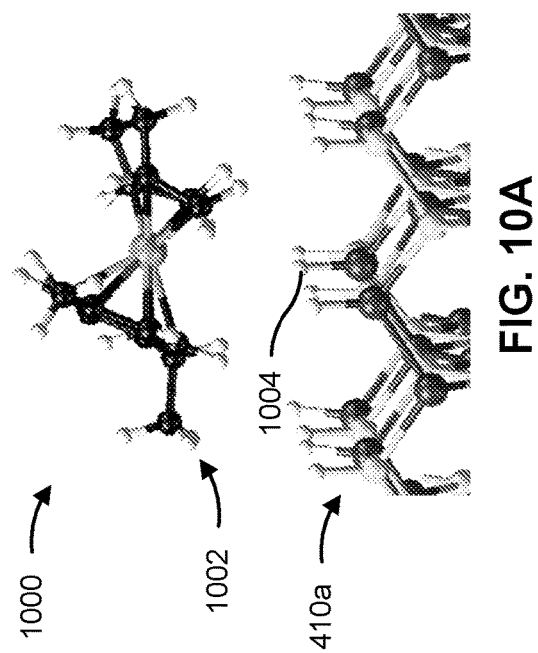

As shown in FIG. 10B, the ruthenium precursor 1002 is adsorbed onto (or bonds with) a germanium site 1004 of the p-type source/drain region 410*a*. This operation is referred to chemisorption, which is a particular type of adsorption in which precursor mediation occurs. Here, a high temperature is applied to the semiconductor device 200 (e.g., the temperature of the processing chamber is elevated to heat the semiconductor device 200) such that the ruthenium precursor 1002 is forced close to the surface of the p-type source/drain region 410*a* and adsorbed by the germanium site 1004 in precursor form. In particular, the high temperature (and, in some cases, the vibration energy of the ruthenium precursor 1002) provides the energy level (e.g., in electron volts (eV)) needed to break the molecular bonds between the first ligand (L1) and the ruthenium of the ruthenium precursor 1002. This results in dissociation of the first ligand from the ruthenium precursor 1002, which provides a bonding site for the ruthenium precursor 1002 to bond to the germanium site 1004. For example, the deposition tool 102 may provide a flow of the ruthenium precursor 1002 into the processing chamber while the temperature inside the processing chamber is in a range of approximately 230 degrees Celsius to approximately 400 degrees Celsius such that the temperature is above the dissociation temperature for a bond of the first ligand of the ruthenium precursor 1002 to be broken in favor of the germanium site 1004 while minimizing the likelihood of dissociation of the first ligand from the ruthenium precursor 1002 in favor of silicon sites on n-type source/drain regions 410*b* of the semiconductor device 200. However, other temperatures are within the scope of the present disclosure. Moreover, a plasma source may alternatively (or additionally) be used to provide the eV energy for dissociation of the first ligand from the ruthenium precursor 1002.

The first ligand preferentially dissociates from the ruthenium precursor 1002 for germanium sites of the p-type source/drain region 410*a* relative to silicon sites of n-type source/drain regions 410*b* due to the lower dissociation energy for the germanium sites relative to the silicon sites. This difference in dissociation energy of the first ligand enables the selectivity in the p-type metal silicide layer 606*a* formation on the p-type source/drain regions 410*a* and not on the n-type source/drain regions 410*b* (e.g., the ruthenium precursor 1002 resists bonding to silicon (Si) sites of n-type source/drain regions 410*b* on the substrate 206 as a result of the greater dissociation energy for silicon relative to the dissociation energy of the first ligand for germanium), as described herein.

Figure 10C:
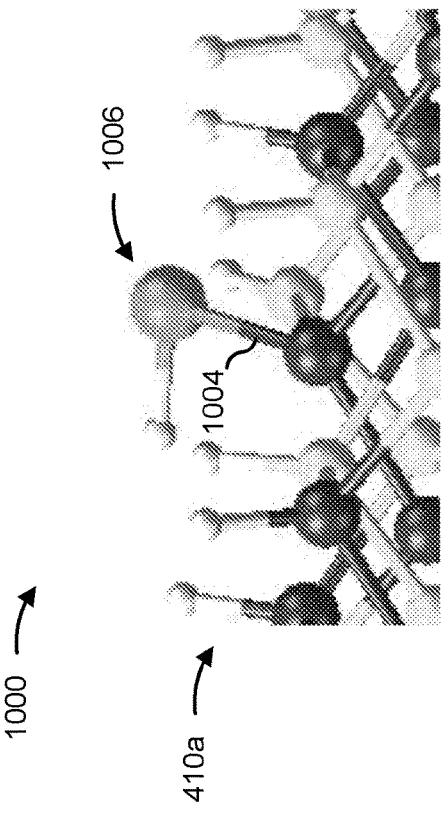

As shown in FIG. 10C, the ruthenium precursor 1002 is bonded to the germanium site 1004 with the second (L2) ligand still attached. Here, the ruthenium precursor 1002 is bonded to the germanium site 1004 in an unstable state. The second ligand provides passivation of the ruthenium in the ruthenium precursor 1002 during the deposition operation of the p-type metal silicide layer 606*a*.

Figure 10D:
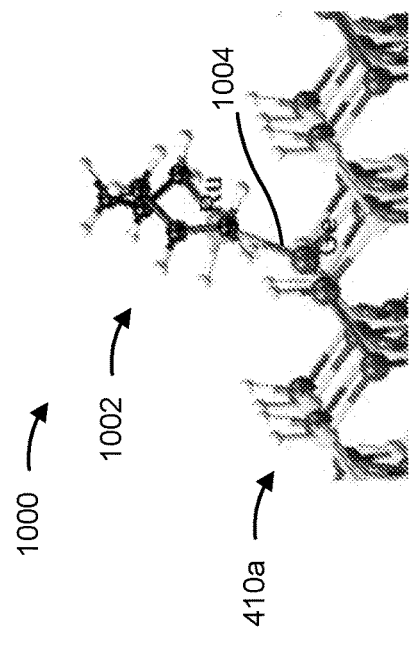

Turning to FIG. 10D, the deposition tool 102 performs a reactant gas operation in which the deposition tool 102 provides a flow of a reactant gas into the processing chamber. The reactant gas includes hydrogen ($H_2$), a combination of hydrogen and argon ($H_2$/Ar), ammonia ($NH_3$), iodomethane ($CH_3I$), a halogen based reactant (e.g., an iodine (I)

containing reactant), and/or another type of reactant gas. The flow of the reactant gas is provided to dissociate the second ligand from the ruthenium precursor 1002 such that only ruthenium 1006 remains bonded to the germanium site 1004 in a stable state, but is not limited thereto. In some embodiments, other materials may be applied to the wafer. This results in the formation of the ruthenium silicide layer (e.g., the p-type metal silicide layer 606a) on the p-type source/drain region 410a. In some implementations, a halogen based reactant gas is also used for initial passivation of the adsorbed ruthenium precursor 1002.

In particular, the ruthenium 1006 consumes silicon (Si) in the p-type source/drain region 410a after fully bonding to the germanium sites 1004 and stabilizing to form a p-type metal silicide layer 606a on the p-type source/drain region 410a. In particular, a ruthenium silicide ($Ru_xSi_y$) layer is formed on the p-type source/drain region 410a.

The operations described in connection with FIGS. 10A-10D may be performed as part of an ALD operation, in which a plurality of "cycles" of alternating ruthenium precursor deposition operations and reactant gas operations are performed to form the ruthenium silicide layer. For example, the deposition tool 102 may perform a first cycle including a first ruthenium precursor deposition operation and a first reactant gas operation to form a first portion of the ruthenium silicide layer, the deposition tool 102 may perform a second cycle including a second ruthenium precursor deposition operation and a second reactant gas operation to form a second portion of the ruthenium silicide layer, the deposition tool 102 may perform a third cycle including a third ruthenium precursor deposition operation and a third reactant gas operation to form a third portion of the ruthenium silicide layer, and so on until a target thickness for the ruthenium silicide layer is achieved. In some implementations, the deposition tool 102 may perform 5 to 10 cycles to achieve one or more dimensions of the p-type metal silicide layer 606a described herein. However, other quantities of cycles are within the scope of the present disclosure.

Moreover, the operations described in connection with FIGS. 10A-10D may be performed in an at least partial vacuum. The semiconductor device 200 may be transferred to another processing chamber of the deposition tool 102 for in-situ n-type metal silicide layer 606b formation (e.g., without breaking the at least partial vacuum). The deposition tool 102 may form the n-type metal silicide layer 606b selectively on an n-type source/drain region 410b (e.g., such that the precursor of the n-type metal silicide layer 606b bonds to silicon sites of the n-type source/drain region 410b and resists bonding to the germanium sites 1004 of the p-type source/drain regions 410a) or non-selectively such that the n-type metal silicide layer 606b is formed on the n-type source/drain region 410b and on the p-type metal silicide layer 606a that is on the p-type source/drain region 410a.

To selectively form the n-type metal silicide layer 606b on an n-type source/drain region 410b (e.g., and not on the p-type metal silicide layer 606a that is on the p-type source/drain region 410a), the deposition tool 102 may provide a flow of a halogen gas into the other processing chamber. The halogen gas is provided to passivate the germanium sites 1004 of the p-type source/drain region 410a, which inactivates the germanium sites 1004. The halogen gas includes sulfur (S), selenium (Se), chlorine (Cl), and/or another halogen that preferentially passivates germanium over silicon. With the germanium sites 1004 passivated, the deposition tool 102 provides a flow of an n-type metal precursor, such as a titanium (Ti) precursor (e.g., titanium chloride ($TiCl_x$) or another type of titanium precursor), into the other processing chamber. The n-type metal precursor (e.g., the titanium precursor) bonds with the silicon sites of the n-type source/drain region 410b (and not to the p-type source/drain region 410a) as a result of the passivation of the germanium sites 1004 of the p-type source/drain region 410a. The deposition tool 102 may form the n-type metal silicide layer 606b by an ALD operation including a plurality of cycles of alternating deposition operations and reactant gas operations, similar to the ALD operation described above for forming the p-type metal silicide layer 606a.

As indicated above, FIGS. 10A-10D are provided as an example. Other examples may differ from what is described with regard to FIGS. 10A-10D.

Figure 11A:
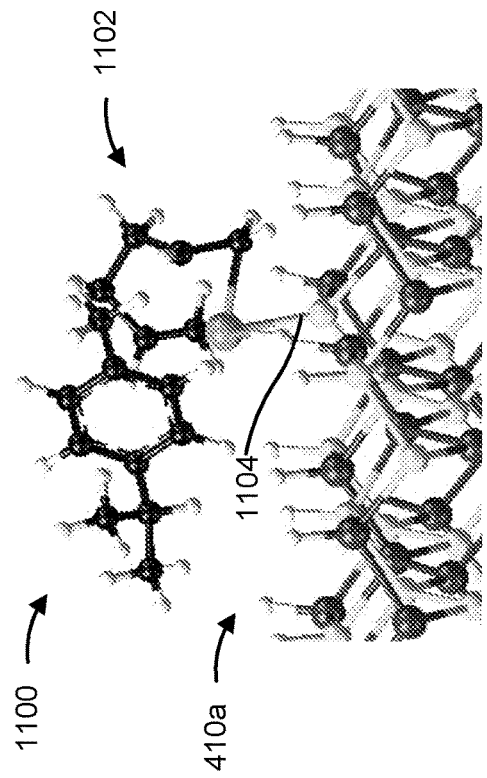
Figure 11B:
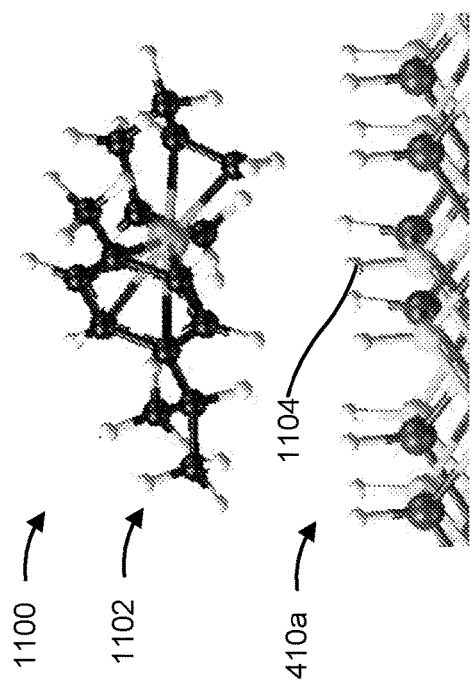

FIGS. 11A and 11B are diagrams of an example implementation 1100 described herein. The example implementation 1100 includes an example in which a ruthenium precursor 1102 attaches to a silicon site 1104 of a p-type source/drain region 410a but does not fully bond with (or stabilize on) the silicon site 1104. In other words, chemisorption does not occur for the ruthenium precursor 1102 onto the silicon site 1104. This is due to the greater dissociation energy for the first ligand of the ruthenium precursor 1102 for the silicon site 1104 relative to the dissociation energy for the first ligand for germanium sites of the p-type source/drain region 410a.

As indicated above, FIGS. 11A and 11B are provided as an example. Other examples may differ from what is described with regard to FIGS. 11A and 11B.

Figure 12A:
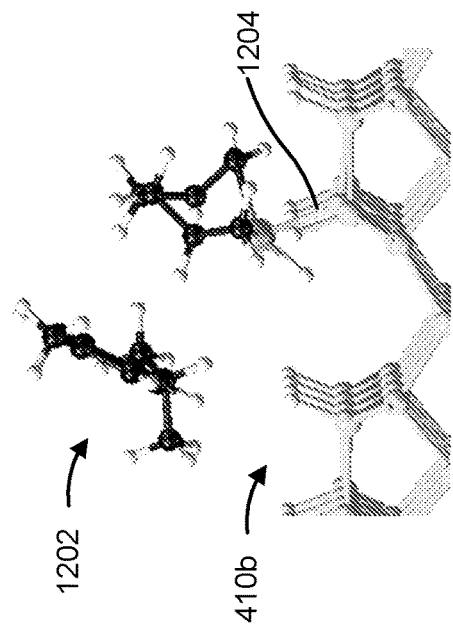
Figure 12B:
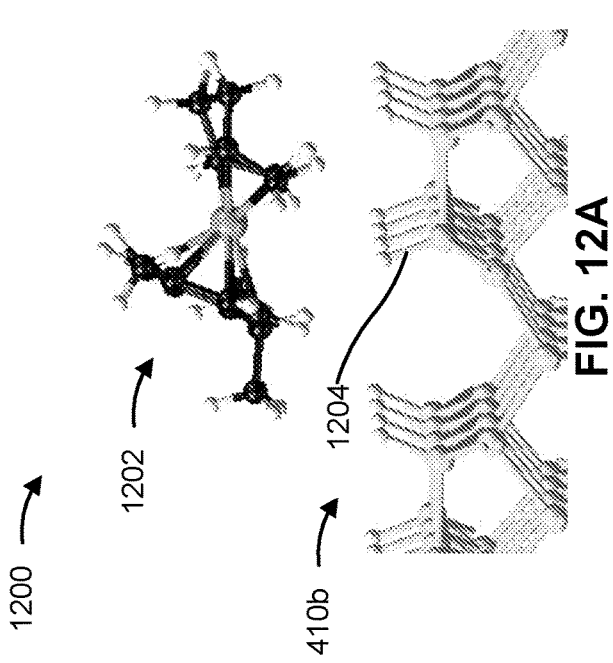

FIGS. 12A and 12B are diagrams of an example implementation 1200 described herein. The example implementation 1200 includes an example in which a ruthenium precursor 1202 attaches to a silicon site 1204 of a n-type source/drain region 410b, which occurs at a greater dissociation energy for the first ligand of the ruthenium precursor 1202 relative to the dissociation energy for the first ligand of the ruthenium precursor 1202 for germanium sites of a p-type source/drain region 410a. Accordingly, the ruthenium precursor 1202 resists bonding to silicon sites of the n-type source/drain region 410b as a result of the greater dissociation energy for silicon relative to the dissociation energy of the first ligand for germanium. In other words, ruthenium precursor 1202 resists chemisorption onto the silicon site 1204.

As indicated above, FIGS. 12A and 12B are provided as an example. Other examples may differ from what is described with regard to FIGS. 12A and 12B.

Figure 13:
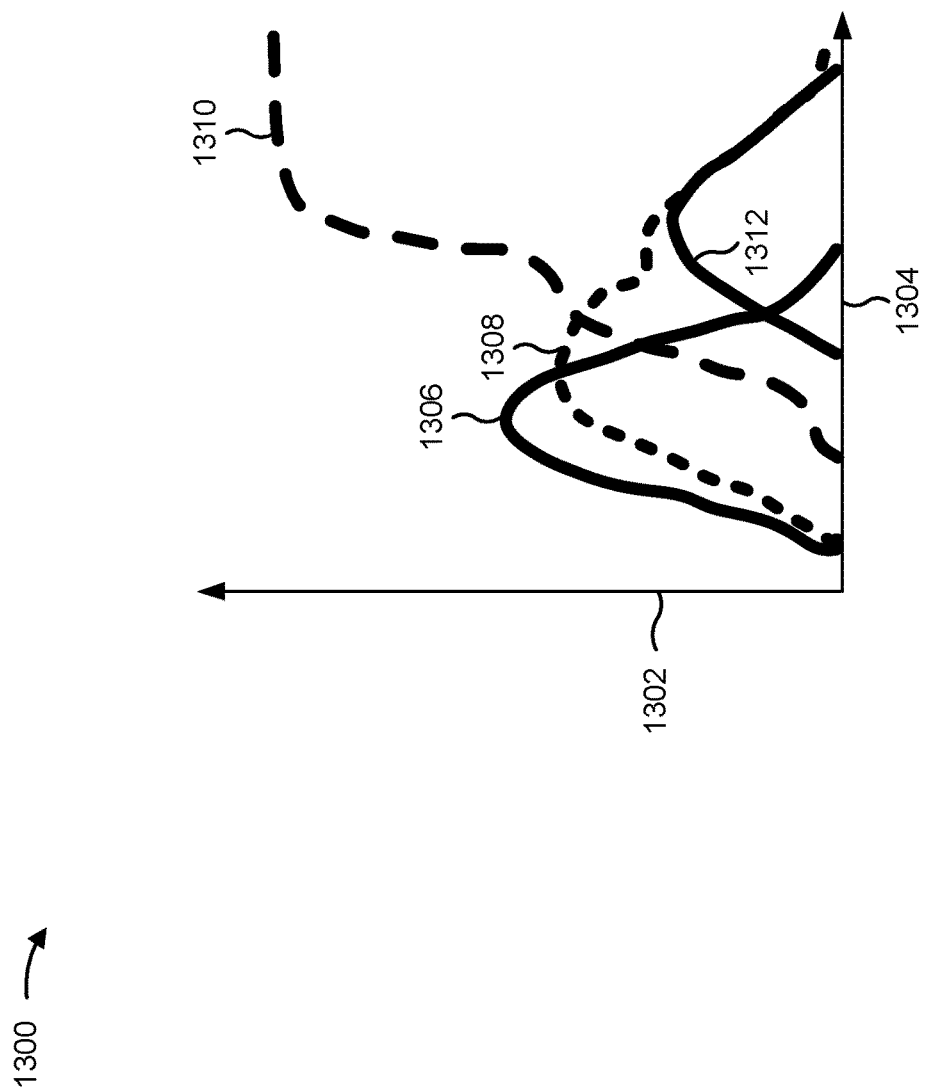
FIG. 13 is a diagram of an elemental composition of layers over a p-type source/drain region described herein.

FIG. 13 is a diagram of an example elemental composition 1300 of layers over a p-type source/drain region 410a described herein. As shown in FIG. 13, the example elemental composition 1300 is illustrated as an intensity 1302 (e.g., of scattered ions as measured by a mass spectrometer of a secondary ion mass spectrometry (SIMS) tool) as a function of depth 1304. In particular, the intensity 1302 of the materials of the metal barrier layer 608, the n-type metal silicide layer 606b, the p-type metal silicide layer 606a, and the top surface of the p-type source/drain region 410a is illustrated from left to right along the depth 1304 in the example elemental composition 1300 of FIG. 13.

As shown in FIG. 13, the intensity of nitrogen 1306 and the n-type metal of the n-type metal silicide layer 606b increases, with the intensity of nitrogen 1306 reaching a peak in the metal barrier layer 608. The intensity of the n-type metal 1308 and the intensity of silicon 1310 (e.g., from the p-type source/drain region 410a) increases, and the intensity of the n-type metal 1308 reaches a peak in the n-type metal silicide layer 606b. The intensity of the silicon 1310 continues to increase through the p-type metal silicide layer 606a and into the p-type source/drain region 410a, whereas the intensity of the n-type metal 1308 decreases through the p-type metal silicide layer 606a. Moreover, the intensity of a p-type metal 1312 of the p-type metal silicide layer 606a increases and peaks in the p-type metal silicide layer 606a, and decreases until reaching the p-type source/drain region 410a.

As indicated above, FIG. 13 is provided as an example. Other examples may differ from what is described with regard to FIG. 13.

Figure 14:
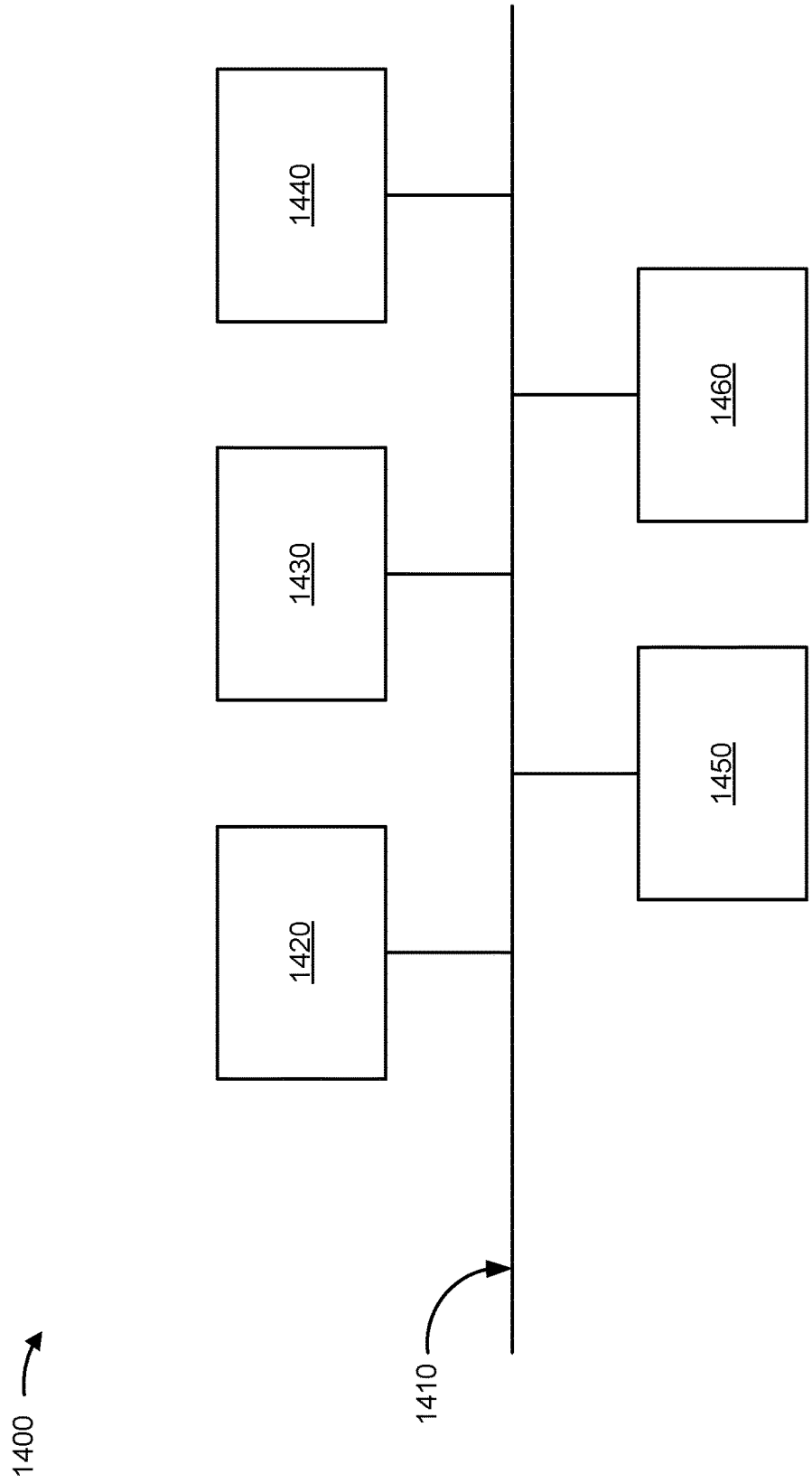
FIG. 14 is a diagram of example components of one or more devices of FIG. 1 described herein.

FIG. 14 is a diagram of example components of a device 1400. In some implementations, one or more of the semiconductor processing tool 102-112 and/or the wafer/die transport tool 114 may include one or more devices 1400 and/or one or more components of device 1400. As shown in FIG. 14, device 1400 may include a bus 1410, a processor 1420, a memory 1430, an input component 1440, an output component 1450, and a communication component 1460.

Bus 1410 includes one or more components that enable wired and/or wireless communication among the components of device 1400. Bus 1410 may couple together two or more components of FIG. 14, such as via operative coupling, communicative coupling, electronic coupling, and/or electric coupling. Processor 1420 includes a central processing unit, a graphics processing unit, a microprocessor, a controller, a microcontroller, a digital signal processor, a field-programmable gate array, an application-specific integrated circuit, and/or another type of processing component. Processor 1420 is implemented in hardware, firmware, or a combination of hardware and software. In some implementations, processor 1420 includes one or more processors capable of being programmed to perform one or more operations or processes described elsewhere herein.

Memory 1430 includes volatile and/or nonvolatile memory. For example, memory 1430 may include random access memory (RAM), read only memory (ROM), a hard disk drive, and/or another type of memory (e.g., a flash memory, a magnetic memory, and/or an optical memory). Memory 1430 may include internal memory (e.g., RAM, ROM, or a hard disk drive) and/or removable memory (e.g., removable via a universal serial bus connection). Memory 1430 may be a non-transitory computer-readable medium. Memory 1430 stores information, instructions, and/or software (e.g., one or more software applications) related to the operation of device 1400. In some implementations, memory 1430 includes one or more memories that are coupled to one or more processors (e.g., processor 1420), such as via bus 1410.

Input component 1440 enables device 1400 to receive input, such as user input and/or sensed input. For example, input component 1440 may include a touch screen, a keyboard, a keypad, a mouse, a button, a microphone, a switch, a sensor, a global positioning system sensor, an accelerometer, a gyroscope, and/or an actuator. Output component 1450 enables device 1400 to provide output, such as via a display, a speaker, and/or a light-emitting diode. Communication component 1460 enables device 1400 to communicate with other devices via a wired connection and/or a wireless connection. For example, communication component 1460 may include a receiver, a transmitter, a transceiver, a modem, a network interface card, and/or an antenna.

Device 1400 may perform one or more operations or processes described herein. For example, a non-transitory computer-readable medium (e.g., memory 1430) may store a set of instructions (e.g., one or more instructions or code) for execution by processor 1420. Processor 1420 may execute the set of instructions to perform one or more operations or processes described herein. In some implementations, execution of the set of instructions, by one or more processors 1420, causes the one or more processors 1420 and/or the device 1400 to perform one or more operations or processes described herein. In some implementations, hardwired circuitry may be used instead of or in combination with the instructions to perform one or more operations or processes described herein. Additionally, or alternatively, processor 1420 may be configured to perform one or more operations or processes described herein. Thus, implementations described herein are not limited to any specific combination of hardware circuitry and software.

The number and arrangement of components shown in FIG. 14 are provided as an example. Device 1400 may include additional components, fewer components, different components, or differently arranged components than those shown in FIG. 14. Additionally, or alternatively, a set of components (e.g., one or more components) of device 1400 may perform one or more functions described as being performed by another set of components of device 1400.

Figure 15:
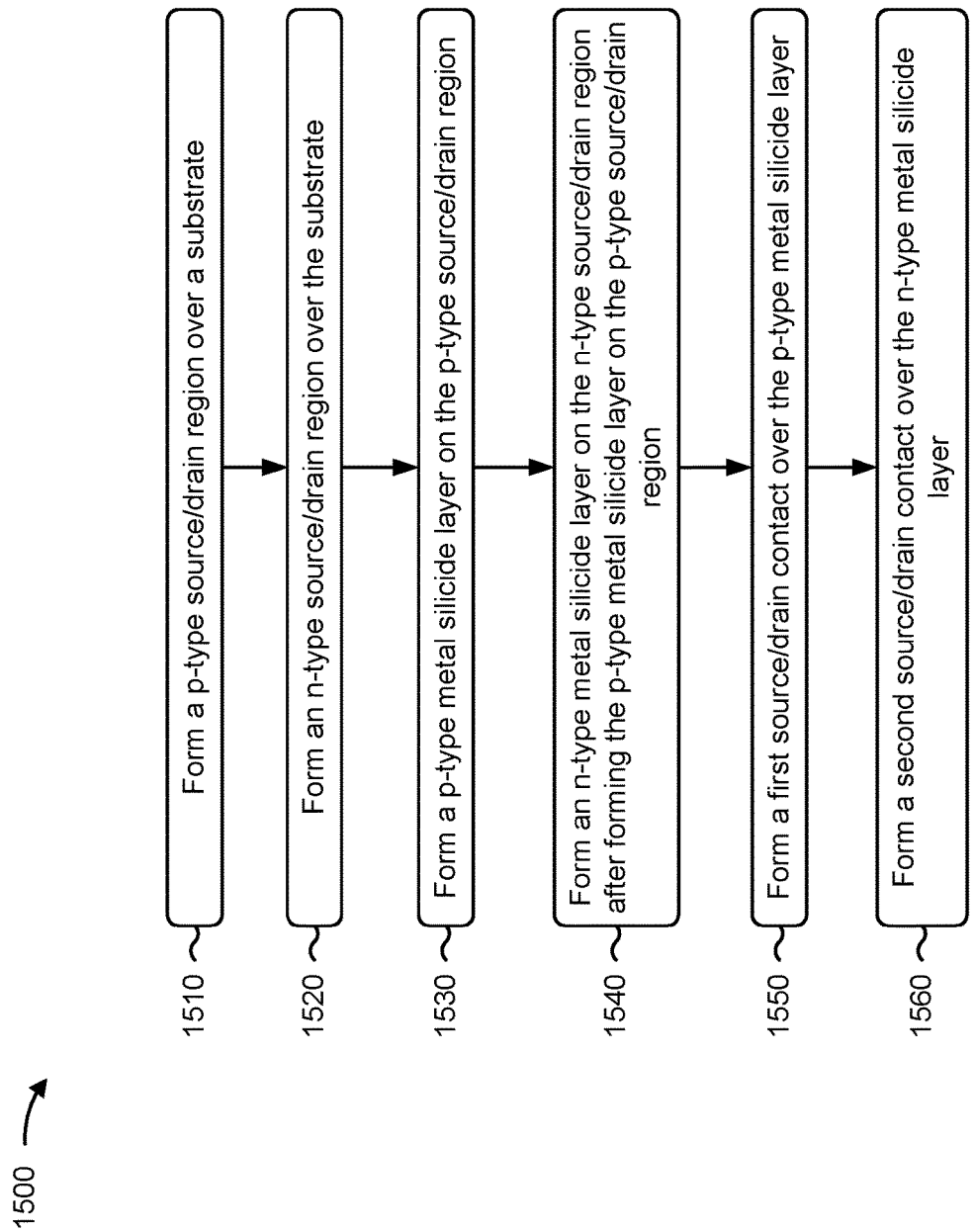

FIG. 15 is a flowchart of an example process 1500 associated with selective dual silicide formation. In some implementations, one or more process blocks of FIG. 15 may be performed by one or more semiconductor processing tools (e.g., the one or more semiconductor processing tools 102-112). Additionally, or alternatively, one or more process blocks of FIG. 15 may be performed by one or more components of device 1400, such as processor 1420, memory 1430, input component 1440, output component 1450, and/or communication component 1460.

As shown in FIG. 15, process 1500 may include forming a p-type source/drain region over a substrate (block 1510). For example, the one or more semiconductor processing tools 102-112 may form a p-type source/drain region 410a over the substrate 206, as described above.

As further shown in FIG. 15, process 1500 may include forming an n-type source/drain region over the substrate (block 1520). For example, one or more of the semiconductor processing tool 102-112 may form an n-type source/drain region 410b over the substrate, as described above.

As further shown in FIG. 15, process 1500 may include forming a p-type metal silicide layer on the p-type source/drain region (block 1530). For example, one or more of the semiconductor processing tools 102-112 may form a p-type metal silicide layer 606a on the p-type source/drain region 410a, as described above. In some implementations, the p-type metal silicide layer 606a is selectively formed on the p-type source/drain region 410a and without a mask over the n-type source/drain region 410b.

As further shown in FIG. 15, process 1500 may include forming an n-type metal silicide layer on the n-type source/drain region after forming the p-type metal silicide layer on the p-type source/drain region (block 1540). For example, one or more of the semiconductor processing tools 102-112 may form an n-type metal silicide layer 606b on the n-type source/drain region 410b after forming the p-type metal silicide layer 606a on the p-type source/drain region 410a, as described above.

As further shown in FIG. 15, process 1500 may include forming a first source/drain contact over the p-type metal silicide layer (block 1550). For example, one or more of the semiconductor processing tools 102-112 may form a first source/drain contact 610 over the p-type metal silicide layer 606a, as described above.

As further shown in FIG. 15, process 1500 may include forming a second source/drain contact over the n-type metal silicide layer (block 1560). For example, one or more of the semiconductor processing tools 102-112 may form a second source/drain contact 610 over the n-type metal silicide layer 606b, as described above.

Process 1500 may include additional implementations, such as any single implementation or any combination of implementations described below and/or in connection with one or more other processes described elsewhere herein.

In a first implementation, the n-type metal silicide layer 606b is selectively formed on the n-type source/drain region 410b and without a mask over the p-type source/drain region 410a. In a second implementation, alone or in combination with the first implementation, process 1500 includes forming, in a same deposition operation, a metal barrier layer 608 over the p-type metal silicide layer 606a and over the n-type metal silicide layer 606b prior to forming the first source/drain contact 610 and prior to forming the second source/drain contact 610. In a third implementation, alone or in combination with one or more of the first and second implementations, a thickness of the n-type metal silicide layer 606b is greater than a thickness of the p-type metal silicide layer 606a.

In a fourth implementation, alone or in combination with one or more of the first through third implementations, process 1500 includes performing, under an at least partial vacuum, a pre-clean operation to clean a top surface of the p-type source/drain region 410a and a top surface of the n-type source/drain region 410b, where forming the p-type metal silicide layer 606a on the p-type source/drain region 410a includes forming the p-type metal silicide layer 606a on the p-type source/drain region 410a without breaking the at least partial vacuum.

In a fifth implementation, alone or in combination with one or more of the first through fourth implementations, forming the n-type metal silicide layer 606b on the n-type source/drain region 410b includes forming the n-type metal silicide layer 606b on the n-type source/drain region 410b without breaking the at least partial vacuum after forming the p-type metal silicide layer 606a on the p-type source/drain region 410a.

Although FIG. 15 shows example blocks of process 1500, in some implementations, process 1500 may include additional blocks, fewer blocks, different blocks, or differently arranged blocks than those depicted in FIG. 15. Additionally, or alternatively, two or more of the blocks of process 1500 may be performed in parallel.

Figure 16:
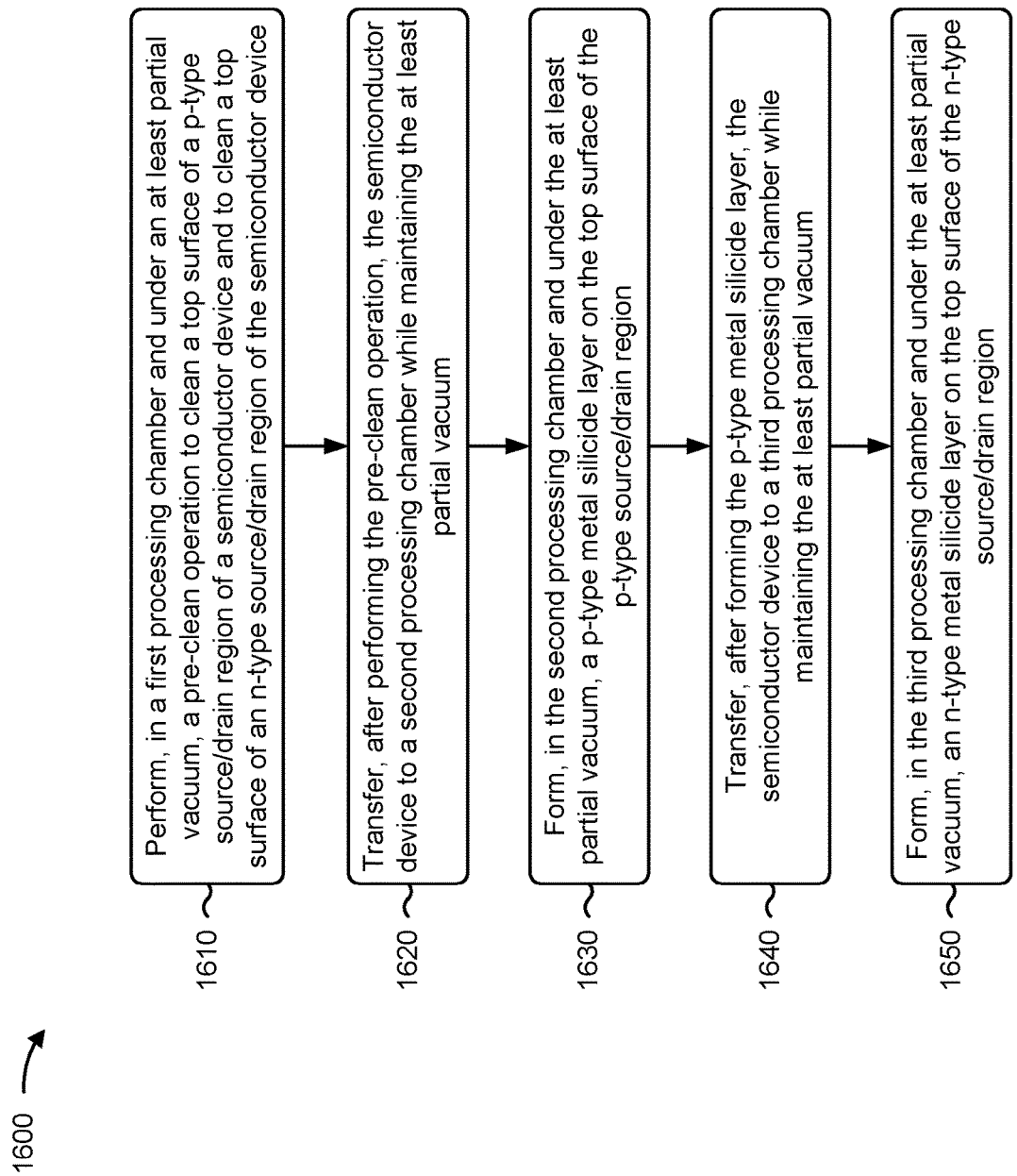

FIG. 16 is a flowchart of an example process 1600 associated with selective dual silicide formation. In some implementations, one or more process blocks of FIG. 16 may be performed by one or more semiconductor processing tools and a wafer/die transport tool (e.g., one or more of the semiconductor processing tools 102-112 and the wafer/die transport tool 114). Additionally, or alternatively, one or more process blocks of FIG. 16 may be performed by one or more components of device 1400, such as processor 1420, memory 1430, input component 1440, output component 1450, and/or communication component 1460.

As shown in FIG. 16, process 1600 may include performing, in a first processing chamber and under an at least partial vacuum, a pre-clean operation to clean a top surface of a p-type source/drain region of a semiconductor device and to clean a top surface of an n-type source/drain region of the semiconductor device (block 1610). For example, the deposition tool 102 may perform, in a first processing chamber of the deposition tool 102 and under an at least partial vacuum, a pre-clean operation to clean a top surface of a p-type source/drain region 410a of the semiconductor device 200 and to clean a top surface of an n-type source/drain region 410b of the semiconductor device 200, as described above.

As further shown in FIG. 16, process 1600 may include transferring, after performing the pre-clean operation, the semiconductor device to a second processing chamber while maintaining the at least partial vacuum (block 1620). For example, the wafer/die transport tool 114 may transfer, after the deposition tool 102 performs the pre-clean operation, the semiconductor device 200 to a second processing chamber (e.g., of the deposition tool 102) while maintaining the at least partial vacuum, as described above.

As further shown in FIG. 16, process 1600 may include forming, in the second processing chamber and under the at least partial vacuum, a p-type metal silicide layer on the top surface of the p-type source/drain region (block 1630). For example, the deposition tool 102 may form, in the second processing chamber and under the at least partial vacuum, a p-type metal silicide layer 606a on the top surface of the p-type source/drain region 410a, as described above.

As further shown in FIG. 16, process 1600 may include transferring, after forming the p-type metal silicide layer, the semiconductor device to a third processing chamber while maintaining the at least partial vacuum (block 1640). For example, the wafer/die transport tool 114 may transfer, after the deposition tool 102 forms the p-type metal silicide layer 606a, the semiconductor device 200 to a third processing chamber (e.g., of the deposition tool 102) while maintaining the at least partial vacuum, as described above.

As further shown in FIG. 16, process 1600 may include forming, in the third processing chamber and under the at least partial vacuum, an n-type metal silicide layer) on the top surface of the n-type source/drain region (block 1650). For example, the deposition tool 102 may form, in the third processing chamber and under the at least partial vacuum, an n-type metal silicide layer 606b on the top surface of the n-type source/drain region 410b, as described above.

Process 1600 may include additional implementations, such as any single implementation or any combination of implementations described below and/or in connection with one or more other processes described elsewhere herein.

In a first implementation, process 1600 includes transferring (e.g., by the wafer/die transport tool 114), after forming the n-type metal silicide layer 606b, the semiconductor device 200 to a fourth processing chamber (e.g., of the deposition tool 102) while maintaining the at least partial vacuum, and forming (e.g., by the deposition tool 102), in the fourth processing chamber and under the at least partial vacuum, a metal nitride barrier layer (e.g., the metal barrier layer 608) over the p-type metal silicide layer 606a and over the n-type metal silicide layer 606b. In a second implementation, alone or in combination with the first implementation, forming the p-type metal silicide layer 606a on the top surface of the p-type source/drain region 410a includes forming the p-type metal silicide layer 606a to a thickness in a range of approximately 5 angstroms to approximately 50 angstroms.

In a third implementation, alone or in combination with one or more of the first and second implementations, process 1600 includes forming the n-type metal silicide layer 606b on the p-type metal silicide layer 606a, where a combined thickness 802 of the n-type metal silicide layer 606b and the p-type metal silicide layer 606a is in a range of approximately 25 angstroms to approximately 85 angstroms. In a fourth implementation, alone or in combination with one or more of the first through third implementations, a ratio of the combined thickness 802 to a thickness 804 of the n-type metal silicide layer on the top surface of the n-type source/drain region is in a range of approximately 1:3 to approximately 17:7.

In a fifth implementation, alone or in combination with one or more of the first through fourth implementations, forming the n-type metal silicide layer 606b on the top surface of the n-type source/drain region 410b includes forming the n-type metal silicide layer 606b without an intervening pre-clean operation between forming the p-type metal silicide layer 606a and forming the n-type metal silicide layer 606b. In a sixth implementation, alone or in combination with one or more of the first through fifth implementations, the p-type metal silicide layer 606a includes at least one of iridium silicide (IrSi), ruthenium silicide (RuSi), nickeling silicide (NiSi), tungsten silicide (WSi), platinum silicide (PtSi), or palladium silicide (PdSi).

Although FIG. 16 shows example blocks of process 1600, in some implementations, process 1600 may include additional blocks, fewer blocks, different blocks, or differently arranged blocks than those depicted in FIG. 16. Additionally, or alternatively, two or more of the blocks of process 1600 may be performed in parallel.

FIG. 17 is a flowchart of an example process 1700 associated with selective dual silicide formation. In some implementations, one or more process blocks of FIG. 17 may be performed by one or more semiconductor processing tools 102-112 (e.g., one or more of the semiconductor processing tools 102-112). Additionally, or alternatively, one or more process blocks of FIG. 17 may be performed by one or more components of device 1400, such as processor 1420, memory 1430, input component 1440, output component 1450, and/or communication component 1460.

As shown in FIG. 17, process 1700 may include providing a flow of a ruthenium (Ru) precursor into a processing chamber (block 1710). For example, the deposition tool 102 may provide a flow of a ruthenium (Ru) precursor 1002 into a processing chamber (e.g., of the deposition tool 102), as described above. In some implementations, a ruthenium precursor (e.g., the ruthenium precursor 1002, the ruthenium precursor 1202) bonds to germanium (Ge) sites 1004 of a p-type source/drain region 410a on the substrate 206 and resists bonding to silicon (Si) sites 1204 of an n-type source/drain region 410b on the substrate 206 as a result of a greater dissociation energy, of a first ligand of a plurality of ligands of the ruthenium precursor, for silicon relative to a dissociation energy of the first ligand for germanium.

As further shown in FIG. 17, process 1700 may include providing a flow of a reactant gas into the processing chamber (block 1720). For example, the deposition tool 102 may provide a flow of a reactant gas into the processing chamber, as described above. In some implementations, the reactant gas disassociates a second ligand of the plurality of ligands from the ruthenium precursor such that ruthenium 1006 of the ruthenium precursor remains bonded to the Ge sites 1004, which results in formation of a ruthenium silicide (RuSi) layer (e.g., a p-type metal silicide layer 606a) on the p-type source/drain region 410a.

Process 1700 may include additional implementations, such as any single implementation or any combination of implementations described below and/or in connection with one or more other processes described elsewhere herein.

In a first implementation, process 1700 includes providing a flow of a halogen gas into another processing chamber, where the halogen gas results in passivation of the germanium sites 1004 of the p-type source/drain region 410a, and providing a flow of a titanium (Ti) precursor into the other processing chamber, where the titanium precursor bonds to the silicon sites 1204 of the n-type source/drain region 410b and resists bonding to the germanium sites 1004 of the p-type source/drain region 410a as a result of the passivation of the germanium sites 1004 of the p-type source/drain region 410a. In a second implementation, alone or in combination with the first implementation, providing the flow of the ruthenium precursor and providing the flow of the reactant gas include providing the flow of the ruthenium precursor and providing the flow of the reactant gas for a plurality of alternating cycles in an ALD operation to form the ruthenium silicide layer on the p-type source/drain region 410a.

In a third implementation, alone or in combination with one or more of the first and second implementations, the second ligand provides passivation of the ruthenium during the ALD operation. In a fourth implementation, alone or in combination with one or more of the first through third implementations, providing the flow of the ruthenium precursor into the processing chamber includes providing the flow of the ruthenium precursor into the processing chamber while a temperature inside the processing chamber is in a range of approximately 230 degrees Celsius to approximately 400 degrees Celsius. In a fifth implementation, alone or in combination with one or more of the first through fourth implementations, the p-type source/drain region 410a is included in the PMOS region 202 on the substrate 206, and the n-type source/drain region 410b is included in an NMOS region 204 on the substrate 206.

Although FIG. 17 shows example blocks of process 1700, in some implementations, process 1700 may include additional blocks, fewer blocks, different blocks, or differently arranged blocks than those depicted in FIG. 17. Additionally, or alternatively, two or more of the blocks of process 1700 may be performed in parallel.

In this way, the techniques described herein enable respective (different) types of metal silicide layers to be formed for p-type source/drain regions and n-type source/drain regions in a selective manner. For example, a p-type metal silicide layer may be selectively formed over a p-type source/drain region (e.g., such that the p-type metal silicide layer is not formed over the n-type source/drain region) and an n-type metal silicide layer may be formed over the n-type source/drain region (which may be selective or non-selective). This provides a low Schottky barrier height between the p-type metal silicide layer and the p-type source/drain region, as well as a low Schottky barrier height between the n-type metal silicide layer and the n-type source/drain region. This reduces the contact resistance for both p-type source/drain regions and n-type source/drain regions.

As described in greater detail above, some implementations described herein provide a method. The method includes forming a p-type source/drain region over a substrate. The method includes forming an n-type source/drain region over the substrate. The method includes forming a p-type metal silicide layer on the p-type source/drain region, where the p-type metal silicide layer is selectively formed on the p-type source/drain region and without a mask over the n-type source/drain region. The method includes forming an n-type metal silicide layer on the n-type source/drain region after forming the p-type metal silicide layer on the p-type source/drain region. The method includes forming a first source/drain contact over the p-type metal silicide layer. The method includes forming a second source/drain contact over the n-type metal silicide layer.

As described in greater detail above, some implementations described herein provide a method. The method includes performing, in a first processing chamber and under an at least partial vacuum, a pre-clean operation to clean a top surface of a p-type source/drain region of a semiconductor device and to clean a top surface of an n-type source/drain region of the semiconductor device. The method includes transferring, after performing the pre-clean operation, the semiconductor device to a second processing chamber while maintaining the at least partial vacuum. The method includes forming, in the second processing chamber and under the at least partial vacuum, a p-type metal silicide layer on the top surface of the p-type source/drain region. The method includes transferring, after forming the p-type metal silicide layer, the semiconductor device to a third processing chamber while maintaining the at least partial vacuum. The method includes forming, in the third processing chamber and under the at least partial vacuum, an n-type metal silicide layer on the top surface of the n-type source/drain region.

As described in greater detail above, some implementations described herein provide a method. The method includes providing a flow of a ruthenium (Ru) precursor into a processing chamber, where the ruthenium precursor bonds to germanium (Ge) sites of a p-type source/drain region on a substrate and resists bonding to silicon (Si) sites of an n-type source/drain region on the substrate as a result of a greater dissociation energy, of a first ligand of a plurality of ligands of the ruthenium precursor, for silicon relative to a dissociation energy of the first ligand for germanium. The method includes providing a flow of a reactant gas into the processing chamber, where the reactant gas disassociates a second ligand of the plurality of ligands from the ruthenium precursor such that ruthenium of the ruthenium precursor remains bonded to the Ge sites, which results in formation of a ruthenium silicide (RuSi) layer on the p-type source/drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
performing, under an at least partial vacuum, a pre-clean operation to clean a top surface of a p-type source/drain region of a substrate and a top surface of a n-type source/drain region of the substrate;
forming a p-type metal silicide layer on the p-type source/drain region without breaking the at least partial vacuum; and
forming an n-type metal silicide layer on the n-type source/drain region.

2. The method of claim 1, wherein at least one of:
the p-type source/drain region is formed in a first recess of a semiconductor device and between first gate structures of the semiconductor device, or
the n-type source/drain region is formed in a second recess of the semiconductor device and between second gate structures of the semiconductor device.

3. The method of claim 2, wherein at least one of:
the p-type source/drain region is at least partially below the first gate structures, or
the n-type source/drain region is at least partially below the second gate structures.

4. The method of claim 1, wherein the pre-clean operation is performed in a first processing chamber and at least one of the p-type metal silicide layer or the n-type metal silicide layer is formed in a second processing chamber.

5. The method of claim 4, wherein the pre-clean operation is performed in the first processing chamber, the p-type metal silicide layer is formed in the second processing chamber, and the n-type metal silicide layer is formed in a third processing chamber.

6. The method of claim 4, further comprising:
transferring the substrate from the first processing chamber to the second processing chamber without breaking the at least partial vacuum.

7. The method of claim 1, wherein the n-type metal silicide layer is selectively formed on the n-type source/drain region and without a mask over the p-type source/drain region.

8. A method, comprising:
performing, in a first processing chamber and under an at least partial vacuum, a pre-clean operation to clean a top surface of a p-type source/drain region of a substrate and to clean a top surface of an n-type source/drain region of the substrate;
transferring, after performing the pre-clean operation, the substrate to a second processing chamber while maintaining the at least partial vacuum; and
forming, in the second processing chamber and under the at least partial vacuum, at least one of a p-type metal silicide layer, on the top surface of the p-type source/drain region, or an n-type metal silicide layer, on the top surface of the n-type source/drain region.

9. The method of claim 8, further comprising:
transferring, after forming the at least one of the p-type metal silicide layer or the n-type metal silicide layer, the substrate to a third processing chamber while maintaining the at least partial vacuum; and
forming, in the third processing chamber and under the at least partial vacuum, a metal nitride barrier layer over the at least one of the p-type metal silicide layer or the n-type metal silicide layer.

10. The method of claim 8, wherein forming the at least one of the p-type metal silicide layer or the n-type metal silicide layer comprises:
forming the p-type metal silicide layer to a thickness in a range of approximately 5 angstroms to approximately 50 angstroms.

11. The method of claim 8, wherein forming the at least one of the p-type metal silicide layer or the n-type metal silicide layer comprises:
forming the n-type metal silicide layer on the p-type metal silicide layer,
wherein a combined thickness of the n-type metal silicide layer and the p-type metal silicide layer is in a range of approximately 25 angstroms to approximately 85 angstroms.

12. The method of claim 11, wherein a ratio of the combined thickness to a thickness of the n-type metal silicide layer on the top surface of the n-type source/drain region is in a range of approximately 1:3 to approximately 17:7.

13. The method of claim 8, wherein forming the at least one of the p-type metal silicide layer or the n-type metal silicide layer comprises:

forming the p-type metal silicide layer; and forming the n-type metal silicide layer without an intervening pre-clean operation between forming the p-type metal silicide layer and forming the n-type metal silicide layer.

14. The method of claim 8, wherein forming the at least one of the p-type metal silicide layer or the n-type metal silicide layer comprises:

forming the p-type metal silicide layer,
wherein the p-type metal silicide layer includes at least one of:
iridium silicide (IrSi),
ruthenium silicide (RuSi),
nickel silicide (NiSi),
tungsten silicide (WSi),
platinum silicide (PtSi), or
palladium silicide (PdSi).

15. A method, comprising:

providing a flow of a ruthenium precursor into a processing chamber,
wherein the ruthenium precursor bonds to germanium sites of a p-type source/drain region on a substrate and resists bonding to silicon sites of an n-type source/drain region on the substrate; and providing a flow of a reactant gas into the processing chamber,
wherein the reactant gas causes a formation of a ruthenium silicide layer on the p-type source/drain region.

16. The method of claim 15, further comprising:

providing a flow of a halogen gas into another processing chamber,
wherein the halogen gas results in passivation of the germanium sites of the p-type source/drain region; and providing a flow of a titanium precursor into the other processing chamber,
wherein the titanium precursor bonds to the silicon sites of the n-type source/drain region and resists bonding to the germanium sites of the p-type source/drain region.

17. The method of claim 15, wherein providing the flow of the ruthenium precursor and providing the flow of the reactant gas comprise:

providing the flow of the ruthenium precursor and providing the flow of the reactant gas for a plurality of alternating cycles in an atomic layer deposition operation to form the ruthenium silicide layer on the p-type source/drain region.

18. The method of claim 17, wherein the reactant gas provides passivation of ruthenium of the ruthenium precursor during the atomic layer deposition operation.

19. The method of claim 15, wherein providing the flow of the ruthenium precursor into the processing chamber comprises:

providing the flow of the ruthenium precursor into the processing chamber while a temperature inside the processing chamber is in a range of approximately 230 degrees Celsius to approximately 400 degrees Celsius.

20. The method of claim 15, wherein the p-type source/drain region is included in a p-type metal oxide semiconductor (PMOS) region on the substrate; and wherein the n-type source/drain region is included in an n-type metal oxide semiconductor (NMOS) region on the substrate.

* * * * *